(12) United States Patent  
Hadley et al.

(10) Patent No.: US 7,967,204 B2  
(45) Date of Patent: *Jun. 28, 2011

(54) ASSEMBLY COMPRISING A FUNCTIONAL DEVICE AND A RESONATOR AND METHOD OF MAKING SAME

(75) Inventors: Mark A. Hadley, Newark, CA (US); Curt L. Carrender, Morgan Hill, CA (US); John Stephen Smith, San Jose, CA (US); Gordon S. W. Craig, Palo Alto, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/248,020

(22) Filed: Oct. 8, 2008

(65) Prior Publication Data

US 2009/0109002 A1 Apr. 30, 2009

Related U.S. Application Data

(63) Continuation of application No. 11/269,400, filed on Nov. 7, 2005, now Pat. No. 7,500,610.

(60) Provisional application No. 60/626,241, filed on Nov. 8, 2004.

(51) Int. Cl.  
*G06K 7/08* (2006.01)

(52) U.S. Cl. .................................. 235/451; 235/492

(58) Field of Classification Search .................. 235/451, 235/492; 340/572.1, 572.5, 572.7, 572.8  
See application file for complete search history.

(56) References Cited

U.S. PATENT DOCUMENTS

| | | |
|---|---|---|
| 4,670,770 A | 6/1987 | Tai |
| 4,818,855 A | 4/1989 | Mongeon et al. |
| 4,857,893 A | 8/1989 | Carroll |
| 4,937,653 A | 6/1990 | Blonder et al. |
| 4,990,462 A | 2/1991 | Sliwa, Jr. et al. |
| 5,008,213 A | 4/1991 | Kolesar et al. |
| 5,032,896 A | 7/1991 | Little et al. |
| 5,048,179 A | 9/1991 | Shindo et al. |
| 5,083,697 A | 1/1992 | Difrancesco |
| 5,099,227 A | 3/1992 | Geiszler et al. |

(Continued)

FOREIGN PATENT DOCUMENTS

DE 199 29 610 C1 10/2000

(Continued)

OTHER PUBLICATIONS

Curtis, C. et al. "Metallizations by Direct-Write Inkjet Printing" *National Renewable Energy Laboratory*, NREL/CP-520-31020, Golden Colorado, Oct. 2001 (pp. 1-6).

(Continued)

*Primary Examiner* — Michael G Lee  
*Assistant Examiner* — Kristy A Haupt  
(74) *Attorney, Agent, or Firm* — Blakely, Sokoloff, Taylor & Zafman LLP

(57) ABSTRACT

A Radio Frequency Identification (RFID) device. The RFID device comprises an antenna assembly and a resonator assembly. The antenna assembly comprises a first substrate and an antenna element. The resonator assembly comprises a second substrate having an integrated circuit connected to a resonator loop. The first substrate and the second substrate are attached to one another. The integrated circuit electrically couples to the antenna element without a direct mechanical contact.

29 Claims, 9 Drawing Sheets

U.S. PATENT DOCUMENTS

| | | | |
|---|---|---|---|
| 5,138,436 A | 8/1992 | Koepf et al. |
| 5,188,984 A | 2/1993 | Nishiguchi |
| 5,205,032 A | 4/1993 | Kuroda et al. |
| 5,212,625 A | 5/1993 | van Andel et al. |
| 5,221,831 A | 6/1993 | Geiszler |
| D343,261 S | 1/1994 | Eberhardt |
| 5,298,685 A | 3/1994 | Bindra et al. |
| 5,353,498 A | 10/1994 | Fillion et al. |
| D353,343 S | 12/1994 | Eberhardt |
| 5,378,880 A | 1/1995 | Eberhardt |
| 5,382,784 A | 1/1995 | Eberhardt |
| 5,382,952 A | 1/1995 | Miller |
| 5,420,757 A | 5/1995 | Eberhardt et al. |
| 5,422,513 A | 6/1995 | Marcinkiewicz et al. |
| 5,430,441 A | 7/1995 | Bickley et al. |
| 5,435,057 A | 7/1995 | Bindra et al. |
| 5,444,223 A | 8/1995 | Blama |
| RE35,119 E | 12/1995 | Blonder |
| 5,514,613 A | 5/1996 | Santadrea et al. |
| 5,517,752 A | 5/1996 | Sakata et al. |
| 5,528,222 A | 6/1996 | Moskowitz et al. |
| 5,545,291 A | 8/1996 | Smith et al. |
| 5,556,441 A | 9/1996 | Courtwright |
| 5,557,470 A | 9/1996 | Shibayama |
| 5,565,846 A | 10/1996 | Geiszler et al. |
| 5,574,470 A | 11/1996 | deVall |
| D378,578 S | 3/1997 | Eberhardt |
| 5,682,143 A | 10/1997 | Brady et al. |
| 5,707,902 A | 1/1998 | Chang et al. |
| 5,708,419 A | 1/1998 | Isaacson et al. |
| 5,715,594 A | 2/1998 | Patterson et al. |
| 5,745,984 A | 5/1998 | Cole, Jr. et al. |
| 5,754,110 A | 5/1998 | Appalucci et al. |
| 5,779,839 A | 7/1998 | Tuttle et al. |
| 5,783,856 A | 7/1998 | Smith et al. |
| 5,798,050 A | 8/1998 | Gaynes et al. |
| 5,818,348 A | 10/1998 | Walczak et al. |
| 5,824,186 A | 10/1998 | Smith et al. |
| 5,904,545 A | 5/1999 | Smith et al. |
| 5,910,770 A | 6/1999 | Ohara |
| 5,914,862 A | 6/1999 | Ferguson et al. |
| 5,995,006 A | 11/1999 | Walsh |
| 6,018,299 A | 1/2000 | Eberhardt |
| 6,019,284 A | 2/2000 | Freeman et al. |
| 6,031,450 A | 2/2000 | Huang |
| 6,040,773 A | 3/2000 | Vega et al. |
| 6,064,116 A | 5/2000 | Akram |
| 6,078,791 A | 6/2000 | Tuttle et al. |
| 6,091,332 A | 7/2000 | Eberhardt et al. |
| 6,094,138 A | 7/2000 | Eberhardt et al. |
| 6,094,173 A | 7/2000 | Nylander |
| 6,100,804 A | 8/2000 | Brady et al. |
| 6,107,920 A | 8/2000 | Eberhardt et al. |
| 6,122,492 A | 9/2000 | Sears |
| 6,133,833 A | 10/2000 | Sidlauskas et al. |
| 6,133,835 A | 10/2000 | De Leeuw et al. |
| 6,134,130 A | 10/2000 | Connell et al. |
| 6,147,605 A | 11/2000 | Vega et al. |
| 6,147,662 A | 11/2000 | Grabau et al. |
| 6,164,551 A | 12/2000 | Altwasser |
| 6,181,287 B1 | 1/2001 | Beigel |
| 6,189,208 B1 | 2/2001 | Estes et al. |
| 6,194,119 B1 | 2/2001 | Wolk et al. |
| 6,195,858 B1 | 3/2001 | Ferguson et al. |
| 6,204,163 B1 | 3/2001 | Panchou et al. |
| 6,206,282 B1 | 3/2001 | Hayes, Sr. et al. |
| 6,219,911 B1 | 4/2001 | Estes et al. |
| 6,222,212 B1 | 4/2001 | Lee et al. |
| 6,229,203 B1 | 5/2001 | Wojnarowski et al. |
| 6,229,442 B1 | 5/2001 | Rolin et al. |
| 6,236,316 B1 | 5/2001 | Eberhardt et al. |
| 6,246,327 B1 | 6/2001 | Eberhardt |
| 6,252,508 B1 | 6/2001 | Vega et al. |
| 6,262,692 B1 | 7/2001 | Babb |
| 6,265,977 B1 | 7/2001 | Vega et al. |
| 6,268,796 B1 | 7/2001 | Gnadinger et al. |
| 6,274,391 B1 | 8/2001 | Wachtler et al. |
| 6,274,508 B1 | 8/2001 | Jacobsen et al. |
| 6,275,156 B1 | 8/2001 | Rasband |
| 6,275,681 B1 | 8/2001 | Vega et al. |
| 6,281,038 B1 | 8/2001 | Jacobsen et al. |
| 6,282,407 B1 | 8/2001 | Vega et al. |
| 6,291,896 B1 | 9/2001 | Smith |
| 6,297,072 B1 | 10/2001 | Tilmans et al. |
| 6,309,912 B1 | 10/2001 | Chiou et al. |
| 6,313,747 B2 | 11/2001 | Imaichi et al. |
| 6,320,543 B1 | 11/2001 | Ohata et al. |
| 6,320,753 B1 | 11/2001 | Launay |
| 6,329,917 B1 | 12/2001 | Leonard |
| 6,357,005 B1 | 3/2002 | Devaux et al. |
| 6,366,468 B1 | 4/2002 | Pan |
| 6,384,425 B1 | 5/2002 | Huber et al. |
| 6,392,213 B1 | 5/2002 | Martorana et al. |
| 6,410,415 B1 | 6/2002 | Estes et al. |
| 6,417,025 B1 | 7/2002 | Gengel |
| 6,420,266 B1 | 7/2002 | Smith et al. |
| 6,448,109 B1 | 9/2002 | Karpman |
| 6,528,351 B1 | 3/2003 | Nathan et al. |
| 6,530,649 B1 | 3/2003 | Pan |
| 6,536,674 B2 | 3/2003 | Kayanakis et al. |
| 6,542,444 B1 | 4/2003 | Rutsche |
| 6,559,666 B2 | 5/2003 | Bernier et al. |
| 6,590,346 B1 | 7/2003 | Hadley et al. |
| 6,606,247 B2 | 8/2003 | Credelle et al. |
| 6,611,237 B2 | 8/2003 | Smith |
| 6,653,157 B2 | 11/2003 | Kondo |
| 6,665,044 B1 | 12/2003 | Jacobsen et al. |
| 6,677,186 B1 | 1/2004 | Zafrany et al. |
| 6,690,598 B2 | 2/2004 | Oguchi et al. |
| 6,696,785 B2 | 2/2004 | Shimoda et al. |
| 6,727,970 B2 | 4/2004 | Grace et al. |
| 6,779,733 B2 | 8/2004 | Akita et al. |
| 6,780,696 B1 | 8/2004 | Schatz |
| 6,794,221 B2 | 9/2004 | Sayyah |
| 6,816,380 B2 | 11/2004 | Credelle et al. |
| 6,841,419 B2 | 1/2005 | Akita et al. |
| 6,844,673 B1 | 1/2005 | Bernkopf |
| 6,853,087 B2 | 2/2005 | Neuhaus et al. |
| 6,856,086 B2 | 2/2005 | Grace et al. |
| 6,863,219 B1 | 3/2005 | Jacobsen et al. |
| 6,864,570 B2 | 3/2005 | Smith et al. |
| 6,867,983 B2 | 3/2005 | Liu et al. |
| 6,908,295 B2 | 6/2005 | Thielman et al. |
| 6,919,680 B2 | 7/2005 | Shimoda et al. |
| 6,957,481 B1 | 10/2005 | Patrice |
| 7,080,444 B1 | 7/2006 | Craig et al. |
| 7,109,867 B2 * | 9/2006 | Forster ...................... 340/572.3 |
| 7,214,569 B2 | 5/2007 | Swindlehurst et al. |
| 7,224,564 B2 | 5/2007 | Anthony |
| 7,244,326 B2 | 7/2007 | Craig et al. |
| 7,261,829 B2 | 8/2007 | Efferenn et al. |
| 7,324,061 B1 | 1/2008 | Hadley |
| 7,336,243 B2 * | 2/2008 | Jo et al. ........................ 343/895 |
| 7,353,598 B2 | 4/2008 | Craig et al. |
| 7,452,748 B1 | 11/2008 | Craig et al. |
| 7,500,610 B1 * | 3/2009 | Hadley et al. ................. 235/451 |
| 7,542,301 B1 | 6/2009 | Liong et al. |
| 7,551,141 B1 | 6/2009 | Hadley et al. |
| 2001/0000631 A1 | 5/2001 | Zandman et al. |
| 2001/0031514 A1 | 10/2001 | Smith |
| 2001/0035759 A1 | 11/2001 | Bernier et al. |
| 2001/0055835 A1 | 12/2001 | Pendse |
| 2002/0001046 A1 | 1/2002 | Jacobsen et al. |
| 2002/0018357 A1 | 2/2002 | Oguchi et al. |
| 2002/0041234 A1 | 4/2002 | Kuzma et al. |
| 2002/0061392 A1 | 5/2002 | Jacobsen et al. |
| 2002/0093396 A1 | 7/2002 | Smith |
| 2002/0114587 A1 | 8/2002 | Golwalkar et al. |
| 2002/0127864 A1 | 9/2002 | Smith et al. |
| 2002/0149107 A1 | 10/2002 | Chang et al. |
| 2003/0029921 A1 | 2/2003 | Akita et al. |
| 2003/0034400 A1 | 2/2003 | Han et al. |
| 2003/0054881 A1 | 3/2003 | Hedrick et al. |
| 2003/0136503 A1 | 7/2003 | Green |
| 2003/0148555 A1 | 8/2003 | Akita et al. |
| 2003/0232174 A1 | 12/2003 | Chang et al. |
| 2004/0026754 A1 | 2/2004 | Liu et al. |

| | | | |
|---|---|---|---|
| 2004/0037053 A1 | 2/2004 | Akita et al. | |
| 2004/0052202 A1 | 3/2004 | Brollier | |
| 2004/0052203 A1 | 3/2004 | Brollier | |
| 2004/0054594 A1 | 3/2004 | Forster et al. | |
| 2004/0183182 A1 | 9/2004 | Swindlehurst et al. | |
| 2005/0040994 A1 | 2/2005 | Mazoki et al. | |
| 2006/0012482 A1* | 1/2006 | Zalud et al. | 340/572.7 |
| 2006/0094168 A1 | 5/2006 | Hoffman et al. | |
| 2006/0118229 A1 | 6/2006 | Ohashi et al. | |

FOREIGN PATENT DOCUMENTS

| | | |
|---|---|---|
| EP | 0 992 939 A1 | 4/2000 |
| EP | 1 014 302 A1 | 6/2000 |
| EP | 1 167 068 | 1/2002 |
| EP | 1381080 A2 | 1/2004 |
| GB | 2379414 | 3/2003 |
| JP | 11353439 A | 12/1999 |
| JP | 2001175837 A | 6/2001 |
| JP | 2003242471 | 8/2003 |
| WO | WO 99/41701 A2 | 8/1999 |
| WO | WO 00/52109 | 9/2000 |
| WO | WO 01/33621 A2 | 5/2001 |
| WO | WO 01/75789 A1 | 10/2001 |
| WO | WO 02/097724 A1 | 12/2002 |
| WO | WO 03/030245 | 4/2003 |
| WO | WO 03/063211 | 7/2003 |
| WO | WO 2004/097731 A2 | 11/2004 |

OTHER PUBLICATIONS

Derby B., "Direct Write of Functional materials by Ink-Jet Printing" *Manchester Materials Science Centre*, The University of Manchester, (pp. 1-19).

Kriebel, Frank (2005). RFID Chip and Tag Assembly challenges: Low Cost RFID IC Packaging and Assembly Workshop, Nov. 14, 2005, Munich, Germany. (12pgs).

PCT Notification Concerning Transmittal of International Preliminary Report on Patentability (Chapter 1 of the Patent Cooperation Treaty) Intl. Application No. PCT/US2005/040410, Mailed on May 18, 2007 (21 pages).

PCT Notification of Transmittal of the International Search Report and the Written Opinion of the International Searching Authority, or the Declaration, International Appln No. PCT/US05/040410, mailed on Nov. 9, 2006 (30 pgs).

Pique, A., et al. "Direct Writing of Electronic and Sensor Materials Using a Laser Transfer Technique" *Material Research Society*, J. Mater. Res., vol. 15, No. 9, Sep. 2000, (pp. 1872-1875).

* cited by examiner

ASSEMBLY COMPRISING A FUNCTIONAL DEVICE AND A RESONATOR AND METHOD OF MAKING SAME

RELATED APPLICATION

This application is a continuation of U.S. patent application Ser. No. 11/269,400, filed Nov. 7, 2005 now U.S. Pat. No.7,500,610 , which is hereby incorporated by reference in its entirety, which is related to and claims the benefit of U.S. Provisional Patent application Ser. No. 60/626,241 filed Nov. 8, 2004, which is hereby incorporated by reference in its entirety, and which is also related to U.S. patent application Ser. No. 11/268,837 filed Nov. 7, 2005 (issued as U.S. Pat. No. 7,353,598) and U.S. patent application Ser. No. 11/269,305 filed Nov. 7, 2005, which are hereby incorporated by reference in their entireties.

GOVERNMENT RIGHT TO APPLICATION

At least certain aspects of the invention described herein were made with U.S. Government support under a federal contract with a contract number H94003-04-2-0406. Accordingly, the Government has certain rights in those aspects of the invention.

FIELD

The present invention relates generally to the field of fabricating electronic devices with small functional elements deposited in a substrate.

BACKGROUND

There are many examples of functional blocks or components that can provide, produce, or detect electromagnetic or electronic signals or other characteristics. The functional blocks are typically objects, microstructures, or microelements with integrated circuits built therein or thereon. These functional blocks have many applications and uses. The functional components can be an array of display drivers in a display where many pixels or sub-pixels are formed with an array of electronic elements. For example, an active matrix liquid crystal display includes an array of pixels or sub-pixels which are fabricated using amorphous silicon or polysilicon circuit elements. Additionally, a billboard display or a signage display such as store displays and airport signs are also among the many electronic devices employing these functional components. Functional components have also been used to make other electronic devices. One example of such use is that of a radio frequency (RF) identification tag (RFID tag) which contains a functional block or several blocks each having a necessary circuit element. Information is recorded into these blocks, which can be remotely communicated to a base station. Typically, in response to a coded RF signal received from the base station, the RFID tag reflects and/or modulates the incident RF carrier back to the base station thereby transferring the information. Such RFID tags are being incorporated into many commercial items for tracking and authenticating.

Systems for remote identification of objects are being used for many purposes, such as identifying items or objects in warehouses, retailer outlets, stores, dealerships, parking lots, airports, train stations and/or at any particular location. Such systems use Radio Frequency (RF) signals to communicate information between an RF reader apparatus and an RF transponder attached to the item or the object. RF transponders and readers are also sometimes referred to as RF Identification (RFID) tags and interrogators, respectively. The RF transponder includes a memory component that can store particular information, such as price, product identification, item serial number, and product information about the object or the item.

Each RFID tag has an individual code containing information related to and identifying the associated object/item. In a typical system, the RF reader sends an RF signal to the remote RFID tag. The antenna in the RFID tag receives the signal from the RF reader, backscatter-modulates the received signal with data temporarily or permanently stored in the RFID tag (such as data indicating the identity prices, (and/or contents of the object/item to which the transponder is attached), produces a sequence of signals in accordance with the transponder's individual code, and reflects this modulated signal back to the RF reader to pass the information contained in the RFID tag to the RF reader. The RF reader decodes these signals to obtain the information from the RFID tag. Likewise, the RFID tag may decode signals received from the reader and write information to the transponder's memory.

RFID tags and labels have a combination of antennas and analog and/or digital electronics, which may include for example communications electronics, data memory, and control logic. Some systems include both "read" and "write" functions; thus, the RF reader can read information previously stored in the RFID tag's memory and the RF transponder can also write new information into the memory in response to signals from the RF reader. In the passive tags, in order to retrieve the information from the chip, a base station or reader sends an excitation signal to the RFID tag or label. The excitation signal energizes the tag or label, and the RFID circuitry transmits the stored information back to the reader. The reader receives and decodes the information from the RFID tag. In general, RFID tags can retain and transmit enough information to uniquely identify individuals, packages, inventory and the like.

RFID tags and labels are widely used to associate an object with an identification code. For example, RFID tags are used in conjunction with security-locks in cars, luggage, and machine, for access control to buildings, and for tracking inventory and parcels. RFID tags are thus used in identifying or inventorying an item or object in a warehouse, retailer outlet, store, dealership, parking lot, airport, train station and/or at any particular location.

It is desirable to reduce the size of the electronics in an RFID tag to be as small as possible. In order to interconnect very small RFID chips with antennas to form RFID tags, straps (sometimes referred to as "interposers" or carriers) with the RFID chips formed therein or thereon are used to connect the RFID chips to the antennas. The straps typically include conductive leads or pads (also sometimes referred to as pad conductors) that are electrically coupled to contact pads of the chips. These pads provide a larger effective electrical contact area than the RFID chips and alleviate some stringent alignment requirement when the straps are coupled to the antennas. The larger area provided by the pads reduces the accuracy required for placement of chips during manufacture while still providing effective electrical connection. Currently, methods or structures of connecting the RFID chips to antennas still involve mechanical or physical interconnection between the straps (hence the chips) and the antennas and thus, some alignments are still required. Furthermore, it is required that the antenna assemblies and the strap assemblies be aligned to one another (strap pad conductors to antenna pads) for the completion of the RFID tags.

As demand for less expensive RFID tags increases, it is desirable to develop ways to manufacture and create RFID tags that involve simple and less expensive assembly.

SUMMARY

Embodiments of the present invention pertain to an electronic assembly, more particularly, to an RFID device that requires no physical contact for electronically coupling an RFID circuit chip to an antenna.

In one aspect, an RFID device is disclosed. The RFID device includes an antenna assembly which includes a first substrate and an antenna element. A resonator assembly including a second substrate and an integrated circuit connected to a resonator loop is attached to the antenna assembly. The integrated circuit is electrically coupled to the antenna element without mechanically contacting one another.

In another aspect, an RFID device is disclosed that comprises an antenna and a resonator assembly. The resonator assembly comprises a first substrate having an integrated circuit connected to a resonator loop. The antenna is electrically interconnected to the integrated circuit by a inductive coupling or capacitive coupling between the integrated circuit and the antenna with the resonator loop not in a direct contact with the antenna for the particular coupling.

In another aspect, a method to form an RFID device is disclosed. In the method, an antenna is formed on a first substrate. A resonator assembly having a second substrate and an integrated circuit connected to a resonator loop is formed. The resonator assembly is electrically coupled the antenna assembly by an inductive coupling or a capacitive. The integrated circuit and the antenna are electrically coupled with a non-direct are direct contact and through a capacitive coupling or an inductive coupling. In one embodiment, the resonator assembly is formed on a continuous web process line that includes a Fluidic-Self Assembly process to deposit the integrated circuit to the second substrate.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION

In the following description, for purposes of explanation, numerous specific details are set forth in order to provide a thorough understanding of the invention. It will be apparent to one skilled in the art, however, that the invention can be practiced without these specific details. In other instances, structures and devices are shown in block diagram form to avoid obscuring the invention.

On many occasions, the disclosure refers to the substrate with one or more functional blocks deposited therein as a "strap assembly." A strap assembly typically includes an integrated circuit block and interconnections. A strap assembly may also include one or more dielectric layers as is known in the art. Electronic devices that can be formed using embodiments include a display, a smart card, a sensor, an electronic tag, an RFID tag, etc.

A device with a strap substrate affixed to another substrate is described in U.S. Pat. No. 6,606,247, which is herby incorporated herein by reference. In one example, the strap substrate is fabricated with one or more recessed receptor sites, and one or more functional or integrated circuit blocks are deposited into the recessed receptor sites, for example, using an FSA process. The functional blocks may be deposited by one or more Fluidic-Self assembly (FSA) operations, by robotic pick-and-place operations, or by other methods. Alternatively, the functional blocks can be mounted on a surface of the strap substrate by known methods. After a functional block is deposited into or mounted onto the corresponding strap substrate, the strap substrate is then attached to another substrate, which may comprise a set of patterned or printed conductor. The conductor can be an electrical element of a device; for instance, the conductor can be elements or parts of an antenna for an RFID device. More than one functional block may be deposited into a strap substrate depending on application.

Methods of making a functional block are known in the art and for instance, can be found U.S. Pat. Nos. 5,783,856; 5,824,186; 5,904,545; 5,545,291; and 6,291,896, which are hereby incorporated by reference in their entireties.

Figure 1:
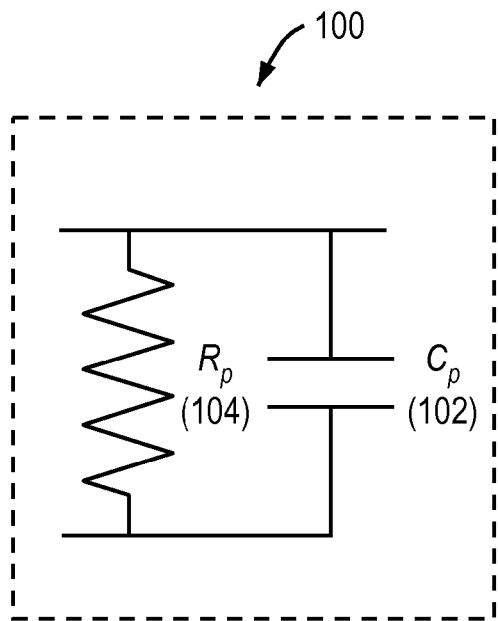
FIGS. 1-2 illustrate examples of equivalent circuits of an RFID integrated circuit chip.
Figure 2:
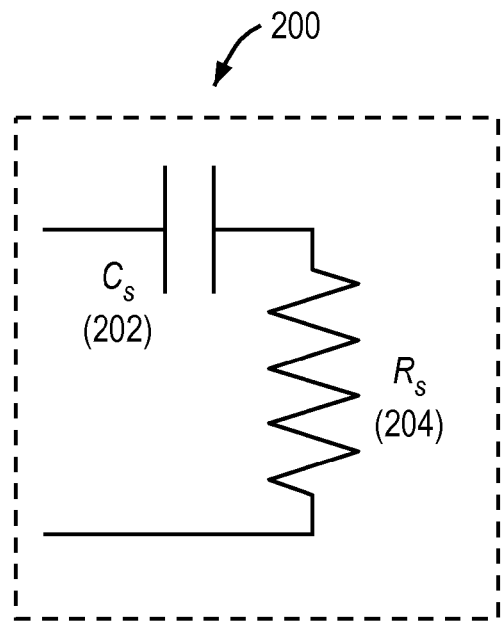

Most common (UHF or higher frequency, 500 MHz-5 GHz) RFID chips have an RF equivalent circuit as shown in FIGS. 1-2. In FIG. 1, a first circuit 100 is basically a capacitor (Cp) 102 that is in parallel with a resistor (Rp) 104. The capacitor 102 represents the combined capacitance of the RF pad of the chip, any multiplier elements in the chip and any parasitic capacitance in the chip. The resistor 104 represents the RF power dissipation in the RFID chip and is a combination of parasitic loss and real power converted to the direct current (DC) chip power.

For all practical purposes, over a range of frequencies around the design frequency for most RFID devices, the parallel circuit 100 is approximately equivalent to a series circuit 200 shown in FIG. 2. In FIG. 2, a second circuit 200 is basically a capacitor (Cs) 202 that is in series with a resistor (Rs) 104. The capacitance in the capacitor 202 represents a RF pad of an RFID chip and parasitic capacitance to ground. The resistor 204 represents the RF power dissipation in the RFID chip and is a combination of parasitic loss and real power converted to the direct current (DC) chip power. Both circuits 100 and 200 are useful in explaining how an RFID tag antenna works.

Figure 3A:
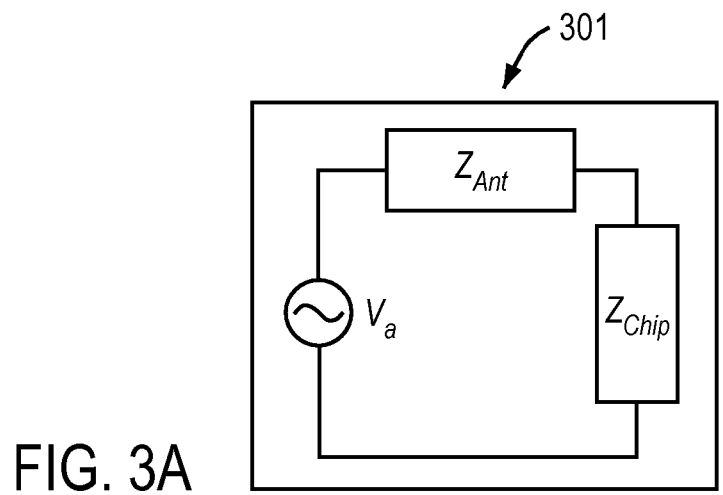
FIG. 3A illustrates an example of an equivalent circuit of an RFID integrated circuit chip coupled to an antenna.

For optimum chip performance at a given frequency, an RFID tag needs to have a good impedance conjugate match between an antenna impedance (Zant) and a chip impedance (Zchip). Thus minimal power is reflected and maximum power is coupled into the chip. FIG. 3A illustrates an equivalent circuit model 301 for an RFID antenna coupled to an RFID tag with Va referring to the voltage source that represents the electric field from the RFID tag. The antenna has a resistance and reactance and can be expressed by the following equation:

$$Zant = Rant + jXant \quad (1)$$

where "Rant" refers to the antenna resistor and "jXant" refers to the antenna reactance.

The RFID chip also has a resistance and reactance and can be expressed by the following equation:

$$Zchip = Rs + jXchip \quad (2)$$

where "Rs" refers to the chip resistor and "jXchip" refers to the chip reactance.

Thus, for a good match we need the chip impedance and antenna impedance to be approximately equal:

$$Zant = Zchip \quad (3)$$

with an imaginary part conjugate match:

$$Xand = -Xchip \quad (4)$$

and, a real part match:

$$Rant = Rs \quad (5)$$

Typically, UHF RFID tags operate in a band of frequency range and as such, it is better to match the RFID chip and antenna over a range of frequencies rather than at one point. RFID tags can also shift in frequency when the RFID tags are placed on particular products. Thus, it is desirable to design the RFID tags to be matched over a wide range of frequencies.

Figure 3B:
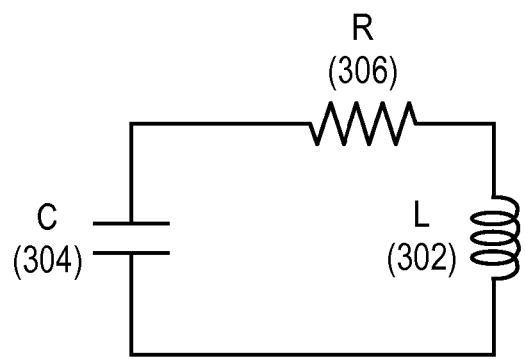
FIG. 3B illustrates an example of an equivalent circuit of adding a resonator to an RFID integrated circuit chip.

In one embodiment, to match an antenna impedance to chip impedance a loop inductor L 302 is added to the chip of an RFID tag so that the loop resonates with the capacitor to cancel reactance (capacitance of the chip) at a given frequency (usually close to the design frequency of the tag). FIG. 3B illustrates an equivalent circuit 300 of an RFID chip with an added loop inductor (L) 302. The RFID chip with the added loop inductor (L) may be referred to as a "resonator." Also shown in the circuit 300 are the chip capacitor (C) 304 and resistor (R) 306. The size of the loop inductor 302 is selected such that the inductance of the loop cancels the capacitance. For example, an RFID chip with a large capacitance usually needs to be coupled to a shorter loop inductor than an RFID chip with a smaller capacitance. The addition of the loop inductor also allows current to be absorbed into the resistor more efficiently thus allowing more energy to be transferred to the RFID chip. Further, the addition of the loop inductor allows for the RFID chip to be electrically connected to the antenna to complete the RFID tag without a direct or physical interconnection as will be further described below. It can also be expressed that the loop inductor size is chosen so that at a particularly frequency, the expressions below are true. Under such conditions, the inductance of the chip cancels the capacitance and can be expressed as followed:

$$\omega^2 LC = 1 \quad (6)$$

where $$\omega = 2\pi(freq) \quad (7)$$

and $$L = 1/\omega^2 C \quad (8)$$

L is the inductor of the chip; C is the capacitor of the chip, and ω is the angular frequency in radians per second.

Figure 4:
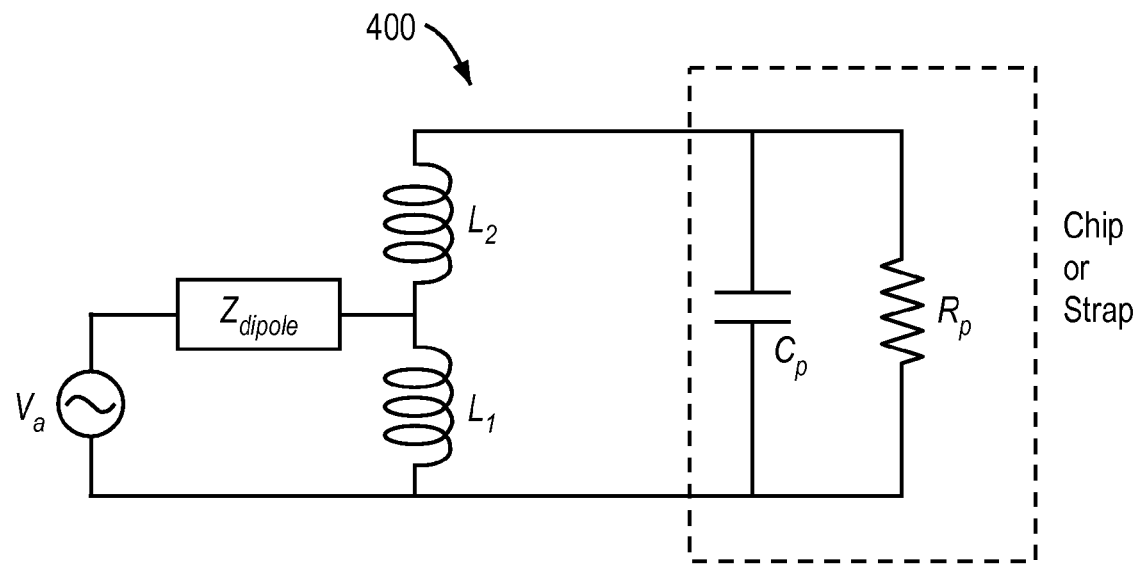
FIG. 4 illustrates an example of an equivalent circuit of an RFID integrated circuit chip coupled to an antenna with a physical contact between the chip components and the antenna.

FIG. 4 illustrates an equivalent circuit 400 of an RFID tag having an RFID chip (or integrated circuit) or strap attached to an antenna. The RFID chip (equivalent circuit shown) can be attached to, adhered onto, embedded within, or otherwise secured to a carrier or a substrate. The antenna (equivalent circuit shown) can also be provided on another substrate. In this figure, Va=a voltage source that represents the electric field;
Zdipole=an impedance of a dipole antenna;
L1,L2=inductors representing the loop that couples the strap or chip to the antenna;
Ca=an effective parallel capacitance of the chip or strap; and
Rp=an effective parallel resistance of the chip or strap.

Figure 5:
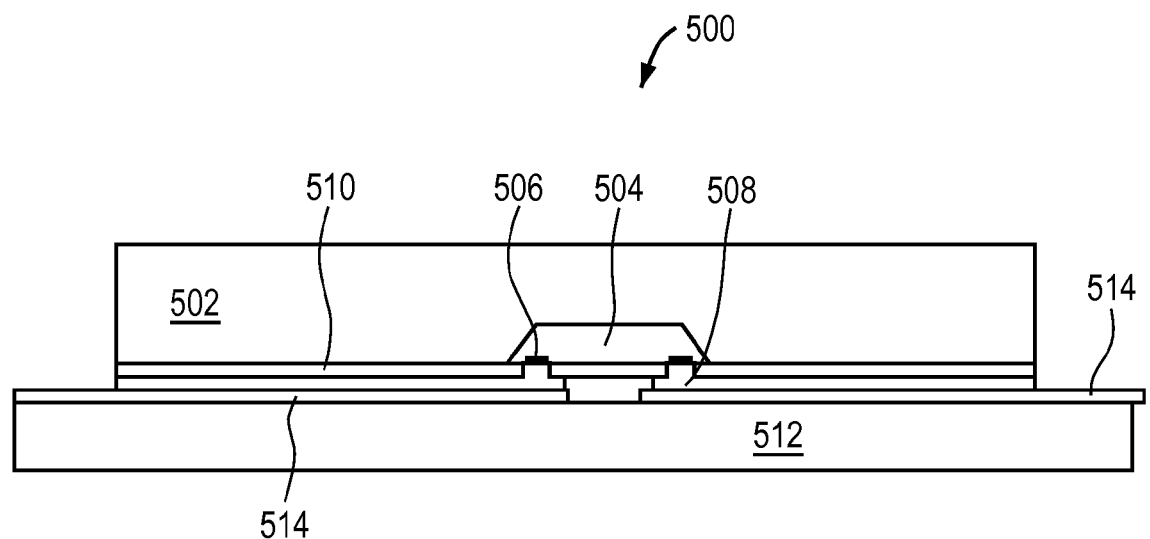
FIG. 5 illustrates an example of a structure with the equivalent circuit of FIG. 4.

FIG. 5 illustrates a structure of an RFID tag 500 that has the equivalent circuit 400 shown in FIG. 4. In this figure, the RFID tag 500 includes an interposer substrate 502 having formed therein or thereon a functional block 504 and interposer pad conductors 508. The functional block 504 includes contact pads 506 which are interconnected to the pad conductors 508. The functional block 504 also includes integrated circuit designed for a particular RFID device as is known in the art. A dielectric layer 510 may be formed on the interposer substrate 502. The pad conductors 508 allow external devices or other conductive components to be electrically connected to the integrated circuit of the functional blocks 504. The interposer substrate 502 with all the necessary components is laminated or coupled to an external electrical device such as an antenna assembly which includes a device substrate 512 and an antenna element 514. The interposer substrate 502 with all the necessary components, e.g., functional block interconnections and dielectrics may be referred herein as a strap or an RFID strap. Methods to form such an RFID tag 500 can be found in U.S. Pat. Nos. 5,783,856; 5,824,186; 5,904,545; 5,545,291; 6,274,508; and 6,281,038, which are all hereby incorporated by reference in their entireties. Methods to form such an RFID tag 500 can also be found in U.S. application Ser. No. 11/159,550 which was issued as U.S. Pat. No. 7,452,748 on Nov. 18, 2008; Ser. No. 11/139,526 which was issued as U.S. Pat. No. 7,615,479 on Nov. 10, 2009; and Ser. No. 11/159,574 which was issued as U.S. Pat. No. 7,542,301 on Jun. 2, 2009, which are all hereby incorporated by reference in their entireties.

As shown in FIG. 5, the functional block 504 and the interposer pad conductors 508 are directly and physically connected to the antenna element 514 for an operative coupling to form the RFID tag 500. Such direct coupling is expensive and complicated in that it requires rigid alignment so that the antenna element (or its leads) can physically and properly contact the interposer pad conductors 508 to cause electrical interconnections. In order to lower the cost of manufacturing as well as to make the assembling of the final product (e.g., the RFID tag) less expensive and less complicated, a resonator assembly is incorporated into the RFID tag.

In one embodiment, the resonator assembly is coupled to the RFID strap so that the RFID strap can be connected to an antenna assembly with less stringent alignment requirements. In one embodiment, a small resonator is connected to an RFID integrated circuit provided in an interposer. The resonator is configured such that the inductance in the resonator cancels the chip capacitance of the integrated circuit, thereby enabling coupling of an antenna on a package to the integrated circuit coupled to the resonator, without a direct (or physical) electrical contact.

A direct or physical contact between an integrated circuit and an antenna (or other conductive pattern) refers to a direct and physical electrical coupling where a mechanical contact is present between a conductive element of the antenna and a conductive pad provided on the integrated circuit. It is through the contact of the conductive elements that a direct current is formed for the electrical interconnection.

On the other hand, in a non-direct non-physical electrical contact between the integrated circuit and the antenna (or other conductive pattern), an electrical coupling is established where a no contact is present. The antenna (or the conductive pattern) is electrically coupled to the integrated circuit via coupling to the resonator by inductance or by capacitance.

Figure 6:
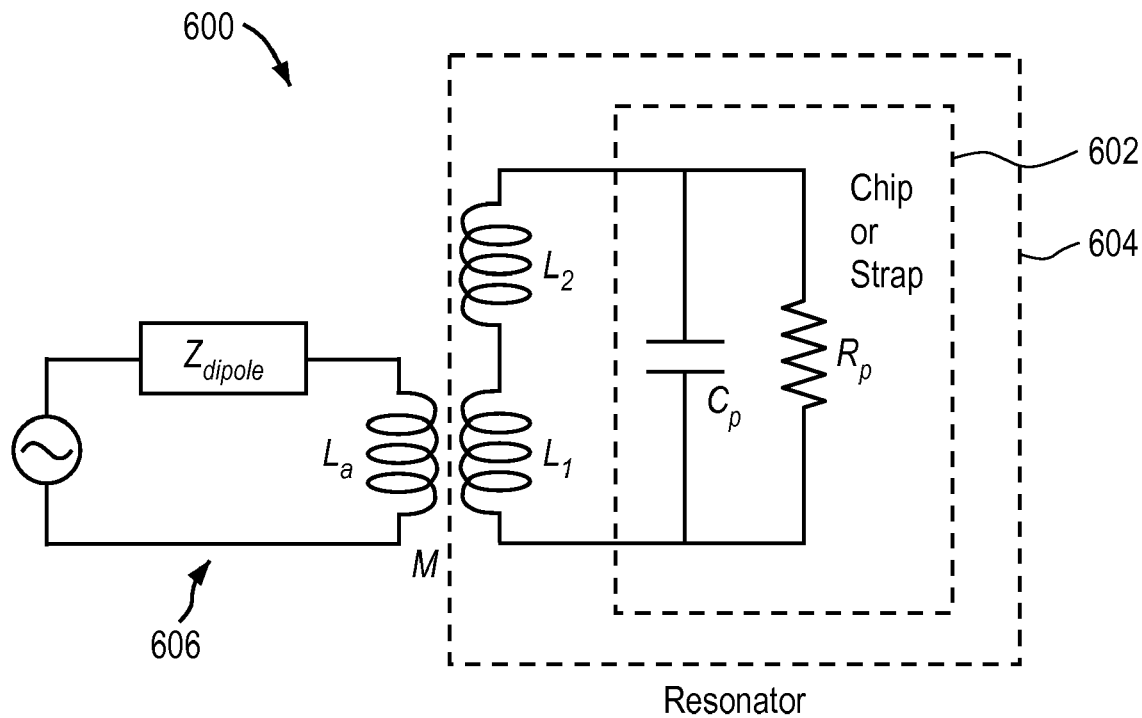
FIG. 6 illustrates an example of an equivalent circuit of an RFID integrated circuit chip coupling to an antenna without a physical or direct contact but with an inductive coupling through a resonator.

FIG. 6 illustrates an equivalent circuit 600 of an RFID tag that has a resonator that is inductively coupled to an antenna provided on a substrate. In this figure, the integrated circuit chip of the RFID tag is connected to a resonator and together the integrated circuit chip and the resonator are placed in close proximity to an antenna to provide an inductive coupling between the antenna and the RFID chip. In this figure, Va=a voltage source that represents the electric field form an antenna;

Zdipole=an impedance of a dipole antenna provided in the RFID tag;

La=an inductor representing the loop from the antenna of the RFID tag;

L1,L2=inductors representing the loop that couples the strap or chip to the antenna;

Cp=an effective parallel capacitance of the chip on the strap;

Rp=an effective parallel resistance of the chip on the strap; and

M=the mutual inductance between the resonator and the rest of the antenna.

The resonator can be placed on an individual substrate (e.g., first substrate) and interconnected to the integrated circuit. The integrated circuit can be placed in another substrate (e.g., second substrate) and interconnects to the resonator. Alternatively, the integrated circuit and the resonator can both be placed or formed on the same substrate (e.g., first substrate or second substrate).

As shown in FIG. 6, an integrated circuit chip 602 is connected or coupled to a resonator 604. The integrated circuit chip 602 has the resistor Rp and the capacitor Cp. The resonator provides the inductors L1 and L2. A mutual inductance exists between the resonator 604, which includes the integrated circuit chip 602, and the antenna 606 as is shown in the figure.

Figure 7:
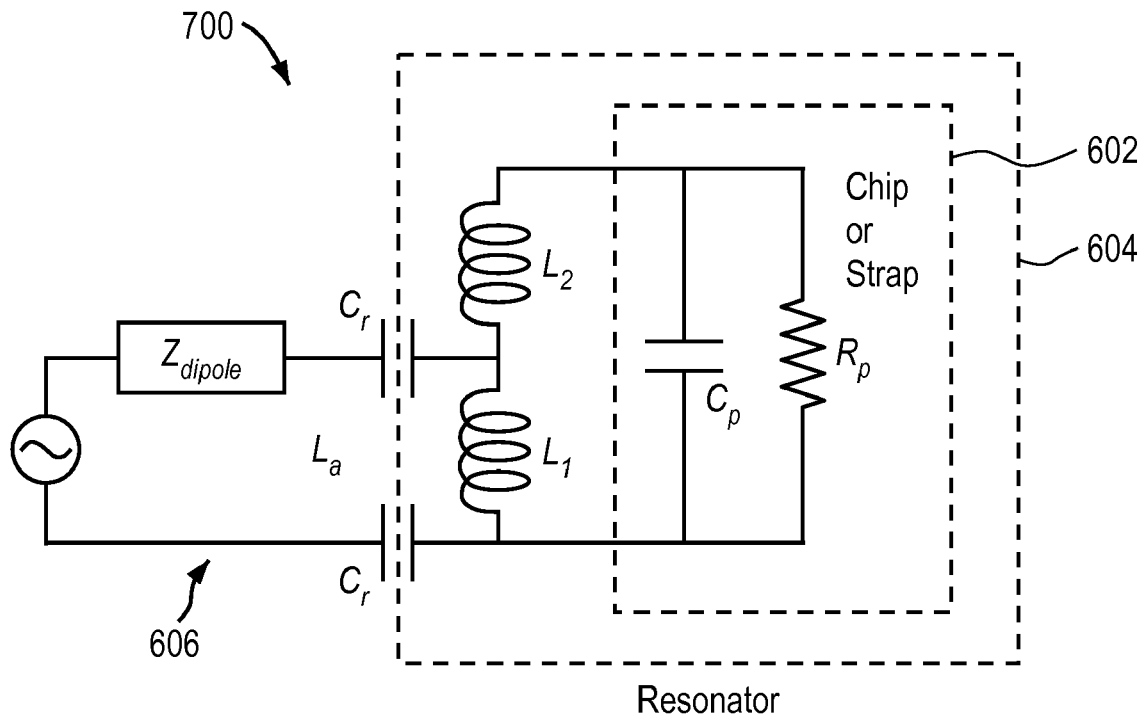
FIG. 7 illustrates an example of an equivalent circuit of an RFID integrated circuit chip coupling to an antenna without a physical or direct contact but with an capacitive coupling through a resonator.

FIG. 7 illustrates an equivalent circuit 700 of an RFID tag that has a resonator that is capacitively coupled to an antenna provided on a substrate. In this figure, the integrated circuit chip of the RFID tag is connected to a resonator and together the integrated circuit chip and the resonator are placed in close proximity to an antenna and separated from the antenna by a dielectric layer so as to form a capacitive coupling between the antenna and the RFID chip. In this figure, Va=a voltage source that represents the electric field form an antenna;

Zdipole=an impedance of a dipole antenna provided in the RFID tag;

La=an inductor representing the loop from the antenna of the RFID tag;

L1,L2=inductors representing the loop that couples the strap or chip to the antenna;

Cp=an effective parallel capacitance of the chip on the strap;

Cr=the capacitive coupling values for the coupling between the resonator and the rest of the antenna; and Rp=an effective parallel resistance of the chip on the strap.

The resonator can be placed on an individual substrate (e.g., first substrate) and interconnected to the integrated circuit. The integrated circuit can be placed in another substrate (e.g., second substrate) and interconnects to the resonator. Alternatively, the integrated circuit and the resonator can both be placed or formed on the same substrate (e.g., first substrate or second substrate).

As shown in FIG. 7, an integrated circuit chip 602 is connected or coupled to a resonator 604. The integrated circuit chip 602 has the resistor Rp and the capacitor Cp. The resonator provides the inductors L1 and L2. A capacitance coupling exists between the resonator 604, which includes the integrated circuit chip 602, and the antenna 606 as is shown in the figure.

Figure 8:
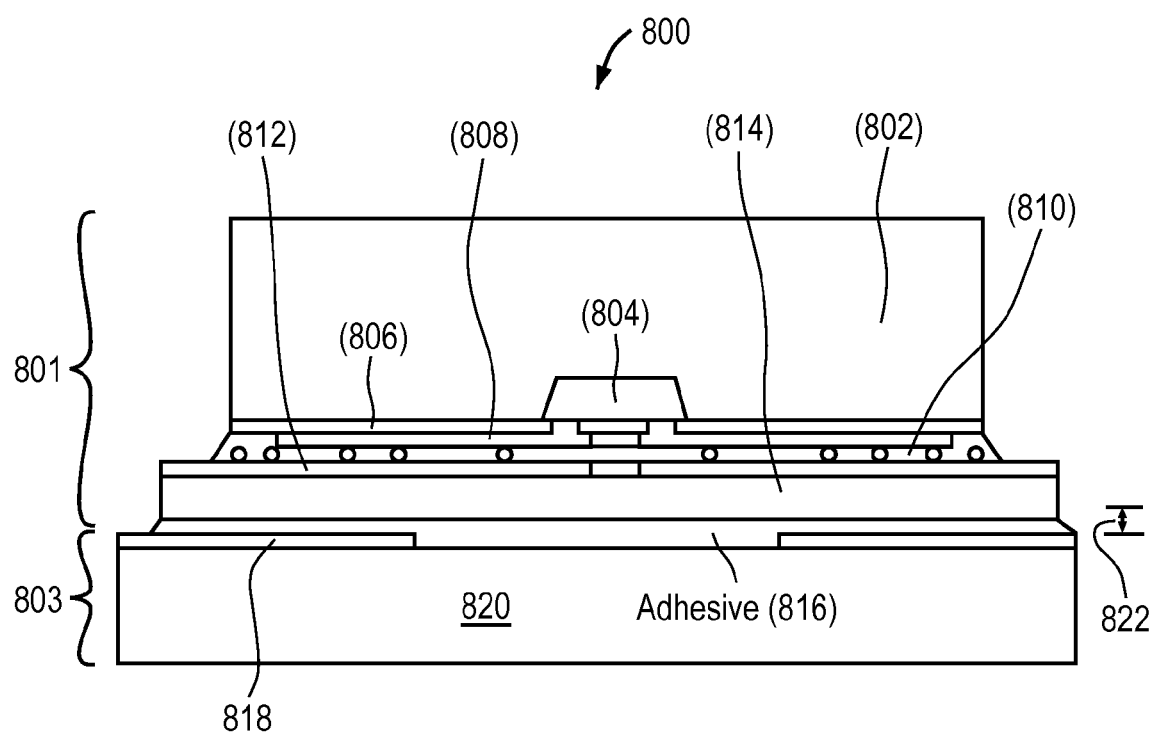
FIG. 8 illustrates an exemplary structure of an RFID integrated circuit chip coupling to an antenna without a physical or direct contact but with an inductive coupling or a capacitive coupling through a resonator with the equivalent circuits shown in FIGS. 6-7.

FIG. 8 illustrates a cross-sectional view of an RFID tag having a resonator assembly coupling to an antenna assembly. The resonator assembly can be attached to the antenna assembly with an adhesive layer and be coupled inductively or capacitively. In FIG. 8, an RFID tag 800 is shown. The RFID tag 800 includes a resonator assembly 801 and an antenna assembly 803 to form the RFID tag 800. The resonator assembly 801 comprises a resonator loop 812 and an integrated circuit chip 804. The antenna assembly 803 comprises an antenna element 818 formed on a substrate 820. The substrate 820 can also be referred to as the device substrate.

An adhesive layer 816 is provided for the resonator assembly 801 to be affixed to the substrate 820. The resonator assembly 801 can be inductively coupled to the antenna assembly in that the resonator assembly 801 is placed in proximity to the antenna assembly 803 so that the resonator loop 812 is only in close proximity with the antenna element 818 but not in direct or physical contact.

Alternatively, the adhesive 816 itself can act as a dielectric layer separating the resonator loop 812 and the antenna element 818 so that the resonator loop 812 and the antenna element 818 are capacitively coupled to one another. In one embodiment, the resonator loop 812 is formed on a resonator substrate 814. In such embodiment, the resonator substrate 814 can also act as a dielectric layer separating the resonator loop 812 and the antenna element 818 so that the resonator loop 812 and the antenna element 818 are capacitively coupled to one another. In capacitive coupling, the resonator assembly 801 can be placed so that the resonator assembly 801 overlaps the antenna assembly 803 but still separated by the resonator substrate 814 and/or the adhesive 816, or both.

The integrated circuit chip 804 can be a functional block or a microstructure deposited or embedded in a strap substrate or a carrier substrate 802. The substrate 802 with the integrated circuit chip 804 can be referred to as a strap. The strap can be made using any of the methods previously disclosed or incorporated by references. In one embodiment, the integrated circuit chip 804 is embedded into the substrate 802 using a Fluidic-Self Assembly process. A dielectric layer may be formed over the substrate 802 as shown in FIG. 8. One or more pad conductors 808 are formed on the substrate 802 to provide convenient interconnections to the integrated circuit chip 804 (through contact pads provide on the chip, not shown). In one embodiment, the strap is coupled or affixed to the resonator loop using a conductive adhesive 810. In one embodiment, after the resonator loop 812 and the pad conductors 808 are connected to one another, the resonator substrate 814 essentially cover all the functional components of the resonator assembly 801.

In one embodiment, the resonator assembly 801 is placed in close proximity to then antenna assembly 803 with a distance 822 preventing a physical contact between the two assemblies.

Figure 9:
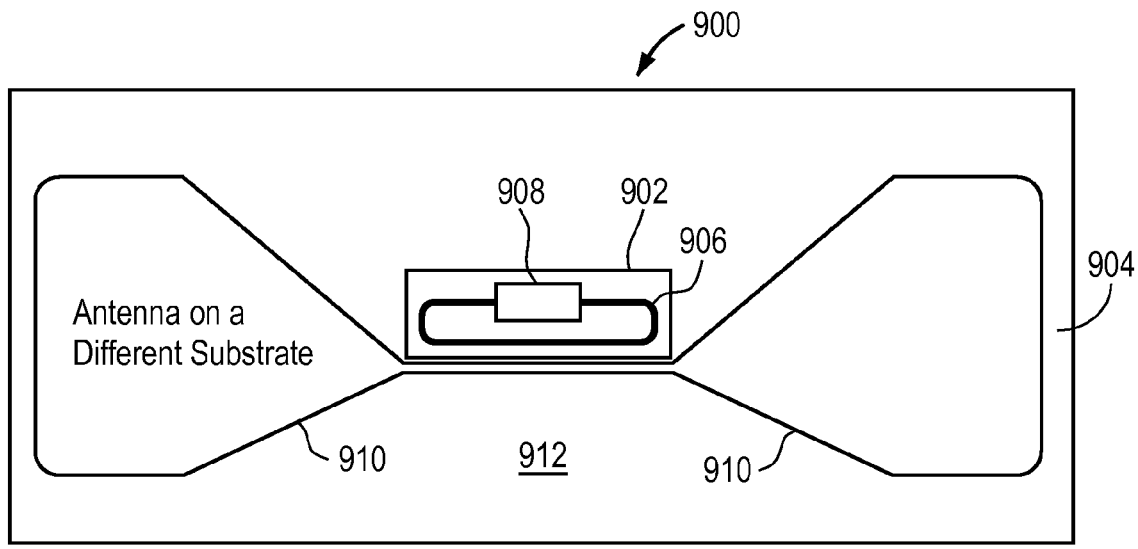
FIGS. 9-10 illustrate in more details the proximate placement of a resonator assembly with an antenna for an inductive coupling.

FIG. 9 illustrates an exemplary embodiment of inductive coupling between a resonator assembly 902 and an antenna assembly 904 to form an RFID tag 900. The resonator assembly 902 comprises a resonator loop 906 and an integrated circuit chip 908. The antenna assembly 904 comprises an antenna element 910 formed on a substrate 912.

The integrated circuit chip 908 is coupled to the resonator loop 906 through various convenient connections. The integrated circuit chip 908 can couple or connect to the resonator loop 906 formed on a first substrate with a flip-chip configuration. For instance, the resonator loop 906 is formed on or in the first substrate and the chip 908 is flipped down and adhered to the surface of the first substrate to make connection to the resonator loop 906. Alternatively, the integrated circuit chip 908 can couple to the resonator loop 906 by conductive attachments, leads, or connections. For instance, the resonator loop 906 is formed on or in the first substrate and the chip 908 is formed in or on a second substrate which is placed in the proximity of the resonator loop 906 and conductive traces or leads are used to connect the chip 908 to the resonator loop 906. The resonator loop 906 can be formed in any suitable patterns, e.g., hot stamped foil strip, boxes, or patterned foil. Materials such as conductive metal, silver, aluminum, copper, or other conductive material can be used to form the resonator loop 906 using methods such as stamping, printing, or film coating.

The integrated circuit chip 908 can be embedded within or formed on the same substrate (e.g., the first substrate) that the resonator loop 906 is formed on and then be interconnected to the resonator loop 906. The integrated circuit chip 908 can also be formed in an interposer (a second substrate) as previously mentioned (such as forming an RFID strap) and interconnected or coupled to the resonator loop 906 formed on a different substrate (e.g., first substrate).

The antenna element 910 can be formed on the substrate 912 using methods known in the art. The antenna element 910 may be an antenna in any of a variety of suitable configurations. The antenna element 910 may be made of a conductive material, such as a metallic material. The antenna element 910 may formed from conductive ink that is printed or otherwise deposited on the substrate 912. Alternatively, the antenna element 910 may be formed from metal deposited on the substrate 912 by any of a variety of suitable, known deposition methods, such as vapor deposition. As a further alternative, the antenna element 910 may be part of a web of antenna material that is adhered to the substrate 912 by suitable methods, for example, by use of a suitable adhesive in a lamination process. The web of a plurality of antennas may be made from, for example, copper, silver, aluminum or other thin conductive material (such as etched or hot-stamped metal foil, conductive ink, sputtered metal, etc.). The antenna element 910 may be formed on a film, coated paper, laminations of film and paper, plastic, polymer, or other suitable substrate. The antenna element 910 can be formed on a packaging of a product using any suitable methods. The antenna element 910 can be formed in, on, or adhere to the substrate 912 which are then affixed or adhered to boxes, packages, covers, foils, items, etc., that have the need for an RFID tag.

Together, the resonator loop coupled to the integrated circuit are referred to as a resonator assembly. The resonator assembly can be made using a web process line. A plurality of resonator assemblies can be made in high density (or high pitch, which is generally the distance between one assembly to another assembly) on an area of web material. Thus, a high number of resonator assemblies can be formed close to one another (which lower the material cost). A roll of resonator assemblies can be manufactured, rolled up for storage, and singulated to be affixed to an antenna assembly, with or without much alignment or registration. In one embodiment, a raw web material is provided. Integrated circuit blocks are assembled onto or into the web material using methods such as Fluidic-self assembly (FSA) or pick-and-place. Dielectric materials may be formed to insulate and/or planarize the assembled integrated circuit blocks. Pad conductors are then formed to enable electrical interconnections to the integrated circuit blocks. Resonator loops can be formed directly on the web material and connected to the pad conductors. Alternatively, resonator loops can be previously formed or independently formed on another web material and can have the form of a ribbon, reel, tape, or roll. The resonator loops (and its web) are then laminated to the web material with the integrated circuit blocks so as to connect the resonator loops to the respective pad conductors. At this point, the resonator assemblies are formed and ready to be assembled or connected to antenna assemblies.

It is to be appreciated that the pitch of the resonator assemblies formed on a web material may have a different pitch compared to the pitch of the antenna assemblies. The resonator assemblies can be formed very close to one another resulting in a higher density number per area of web material. In other words, a higher or much higher number of resonator assemblies are formed per area of web material compared to a smaller number of antenna assemblies being formed per comparable area of web material). In one embodiment, there are about 500-2000 units of resonator assemblies formed per square foot or in another embodiment, 5-10 per square inch of web materials. Typically, a resonator assembly may be about 7 mm by 25 mm—this is much smaller than an antenna assembly, which may be about 100 mm by 17 mm). It is to be understood that the numbers listed herein are only examples for illustration purpose, more or less may be formed in a square inch or foot area depending on applications, materials, and fabrication process. Thus, cutting and singulating, or otherwise coupling the resonator assemblies to the resonator assemblies may involve the appropriate indexing, registration, matching, and cutting.

As shown in FIG. 9, in one embodiment, the resonator assembly 902 is placed in proximity to an antenna assembly 904 formed on a different substrate 912 to form the RFID tag 900. In this embodiment, an inductive coupling is created between the integrated circuit 908 and the antenna 910. No direct physical interconnection is required. With proximity placement being the only requirement with respect to alignment for proper coupling between the resonator assembly 902 and the antenna assembly 904, it becomes less expensive and much easier to complete the final step of assembling or forming an RFID tag. For example, the manufacturer of product that has the need for the RFID tag can have the product include the antenna assembly (which can be cheaply made) and all that is required is for the manufacture to obtain a resonator assembly and affix the resonator assembly in a close proximity to the antenna assembly on the product. Alternatively, many current manufacturing systems can be used to complete the final assembling of the RFID tag with minimal or no modification to accommodate a stringent alignment or registration requirement.

Figure 10:
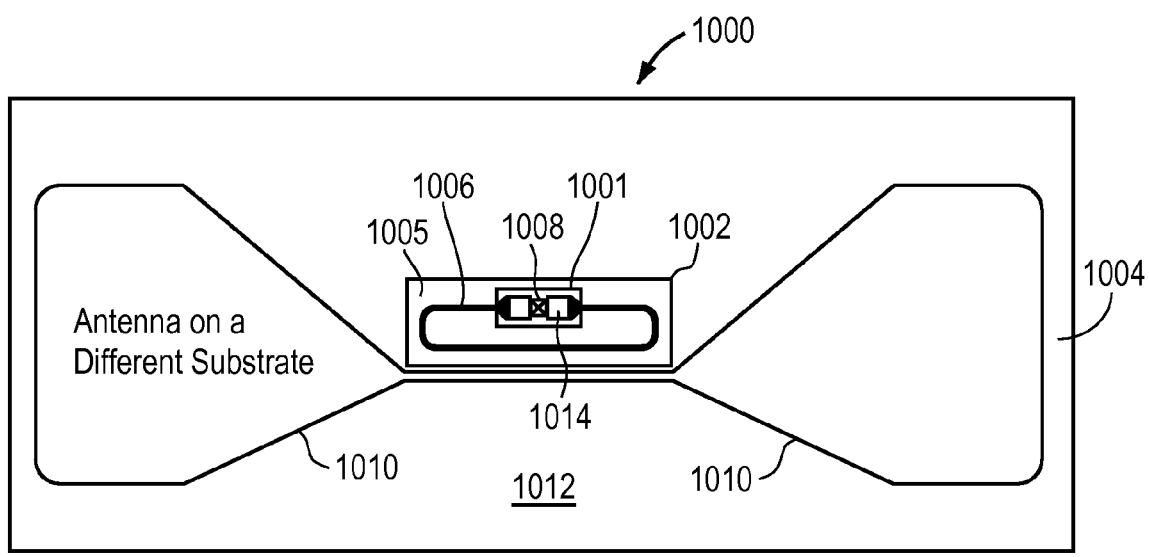

FIG. 10 illustrates another exemplary embodiment of inductive coupling between a resonator assembly 1002 and an antenna assembly 1004 to form an RFID tag 1000. The resonator assembly 1002 comprises a resonator loop 1006 and an integrated circuit chip 1008. The antenna assembly 1004 comprises an antenna element 1010 formed on a substrate 1012 similar to the antenna assembly 904. The RFID tag 1000 is similar to the RFID tag 900 in FIG. 9 with the addition that the integrated circuit chip 1008 is formed in an interposer or a strap 1001, which is attached to or placed on a substrate 1005 that the resonator loop 1006 is formed in or on.

As before, the integrated circuit chip 1008 is coupled to a resonator loop through various convenient connections. The integrated circuit chip 1008 can couple or connect to the resonator loop 1006 formed on a first substrate 1005 with a flip-chip configuration. The resonator loop 1006 is formed on or in the first substrate and the chip 1008 is flipped down and adhered to the surface of the first substrate to make connections to the resonator loop 1006. Alternatively, the integrated circuit chip 1008 can couple to the resonator loop 1006 by conductive attachments, leads, or connections. For example, the chip 1008 includes contact pads which are further connected to larger pad conductors 1014 provided on the interposer 1001 substrate, which are then further connected to the resonator loop 1006. In one embodiment, the pad conductors and the resonator loop are formed on the same layer and can also be made of the same material. The resonator loop 1006 and the chip 1008 formed in or on a second substrate is placed in the proximity of the resonator loop 1006 and conductive traces or leads can be used to connect the chip 1008 to the resonator loop 1006. The interposer 1001 is also adhered or otherwise laminated to the resonator substrate 1005 and interconnections established. Method of forming an interposer that includes an RFID integrated circuit can be found in U.S. Pat. Nos. 5,783,856; 5,824,186; 5,904,545; 5,545,291; 6,274,508; and 6,281,038, and U.S. application Ser. No. 11/159,550 which was issued as U.S. Pat. No. 7,452,748 on Nov. 18, 2008; Ser. No. 11/139,526 which was issued as U.S. Pat. No. 7,615,479 on Nov. 10, 2009; and Ser. No. 11/159,574 which was issued as U.S. Pat. No. 7,542,301 on Jun. 2, 2009, which are all hereby incorporated by reference in their entireties.

The antenna element 1010 can be formed on the substrate 1012 using methods known in the art similar to the antenna element 910. The antenna 1010 may be an antenna in any of a variety of suitable configurations. The antenna 1010 may be made of a conductive material, such as a metallic material. The antenna 1010 may formed from conductive ink that is printed or otherwise deposited on the substrate 1012. Alternatively, the antenna 1010 may be formed from metal deposited on the substrate 1012 by any of a variety of suitable, known deposition methods, such as vapor deposition. As a further alternative, the antenna 1010 may be part of a web of antenna material that is adhered to the substrate 1012 by suitable methods, for example, by use of a suitable adhesive in a lamination process. The web of a plurality of antennas may be made from, for example, copper, silver, aluminum or other thin conductive material (such as etched or hot-stamped metal foil, conductive ink, sputtered metal, etc.). The antennas 1010 may be on a film, coated paper, laminations of film and paper, or other suitable substrate. The antenna element 1010 can be formed on a packaging of a product using any suitable methods.

As shown in FIG. 10, and similar to FIG. 9, the resonator assembly 1002 is placed in proximity to an antenna assembly 1004 formed on a different substrate 1012 to form the RFID tag 1000. In this embodiment, an inductive coupling is created between the integrated circuit 1008 and the antenna 1010. No direct physical interconnection is required.

Figure 11:
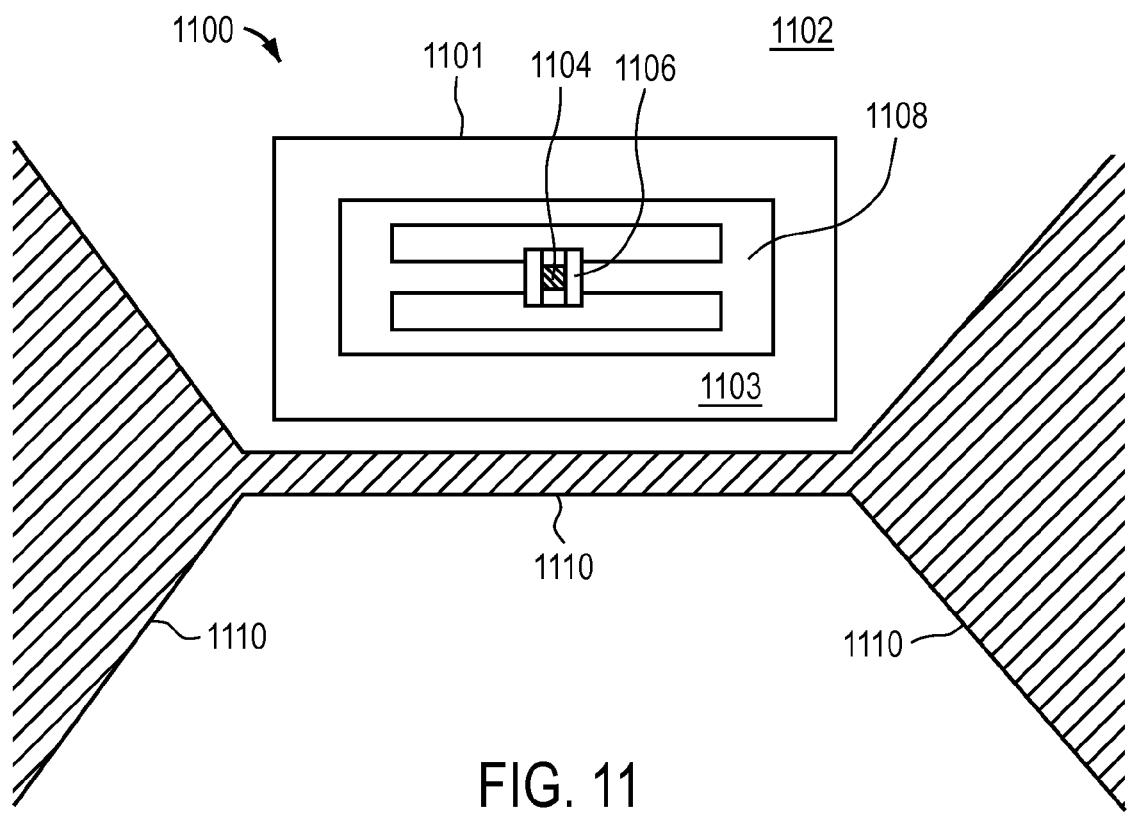
FIGS. 11-12 illustrate exemplary embodiments of a strap that includes both an RFID integrated circuit chip and a resonator loop formed therein or thereon.
Figure 12:
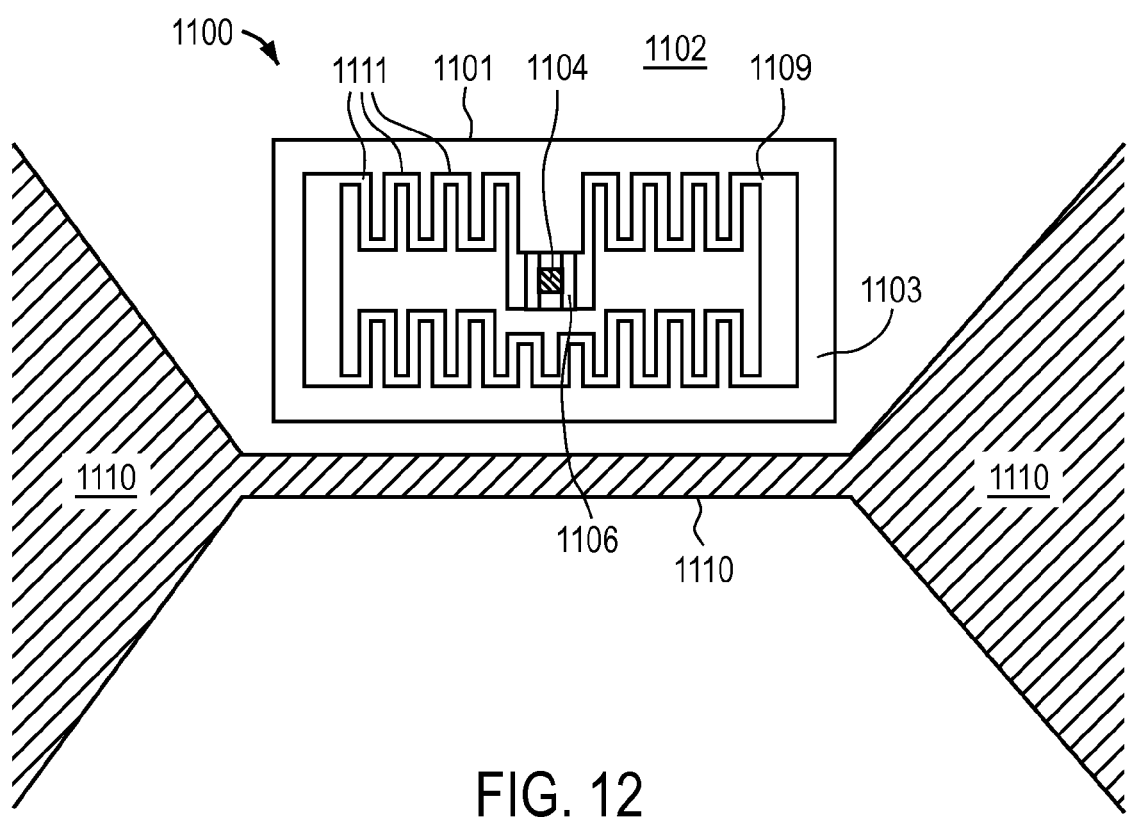

In one embodiment, a current configuration of an RFID strap is modified so that the strap itself can be made to include a resonator loop formed thereon. As previously discussed, (e.g., with respect to FIG. 5), a strap assembly includes an integrated circuit block in a substrate and pad conductors formed on the substrate and connected to the integrated circuit blocks. The strap assembly can further include a resonator loop so that the strap assembly itself can be inductively or capacitively coupled to an antenna assembly without a direct (or physical/contact) connection. FIGS. 11-12 illustrate exemplary embodiments of forming a resonator loop directly on an interposer (RFID strap) that includes a resonator loop incorporated therein.

FIG. 11 illustrates an exemplary embodiment of a strap 1101 that includes a resonator loop formed therein/thereon. In one embodiment, the strap 1101 replaces the resonator assembly 902 shown in FIG. 9 and the resonator assembly 1002 shown in FIG. 10. Thus, instead of having two separate substrates, a first substrate for the resonator loop and a second substrate for the RFID integrated circuit, there is only one substrate in the strap 1101 shown in FIG. 11.

In FIG. 11, an RFID tag includes a substrate 1102 having printed thereon or therein an antenna element 1110. A strap 1101 is placed in close proximity with the antenna element 1110 and can also be placed on the substrate 1102 (but need not to). The strap 1101 is placed in a location such that a resonator loop 1108 formed on a strap substrate 1103 is in close proximity to the antenna element 1110 for an inductive coupling. The strap 1101 includes the strap substrate 1103, the resonator loop 1108, and RFID integrated circuit 1104, and pad conductors 1106. The RFID integrated circuit 1104 can be embedded within a receptor provided on the strap substrate 1101 as previously disclosed. The RFID integrated circuit 1104 can also be attached, placed, affixed, or otherwise secured to the strap substrate 1101 using other suitable methods. The RFID integrated circuit 1104 include contact pads (not shown) which are connected to pad conductors formed on the strap substrate 1101 to allow the RFID integrated circuit 1104 to be electrically coupled to external conductive elements (e.g., antenna).

As shown in FIG. 11, the pad conductors 1106 are connected to the portions of the resonator loop 1108. The resonator loop 1108 can be formed to have any suitable pattern to allow efficient transfer of energy and inductive coupling to the antenna element 1110. As shown in FIG. 11, the resonator loop 1108 has a boxed-like loop shape. In one embodiment, the shape of the resonator loop 1108 is selected so that it is suitable for a operation at a particular frequency range, for example, about 2.45 GHz range for a strap 1101 of a size about 9×4.5 mm.

The substrate 1102 can be the packaging of a product (e.g., a box or cover). The substrate 1102 can also be a label that is affixed to a location on the packaging of a product. The substrate 1102 can also be made to include an adhesive label or other material to allow the placement of the substrate 1102 to a product. The strap 1101 with resonator loop 1108 can be sized so that it is no larger in size or area than a postage stamp or the like.

FIG. 12 illustrates another exemplary embodiment of a strap that includes a resonator loop formed therein/thereon. In the present embodiment, a strap 1101 replaces the resonator assembly 902 shown in FIG. 9 and the resonator assembly 1002 shown in FIG. 10. The strap 1101 in FIG. 12 is similar to the strap 1101 previously described with respect to FIG. 11 with the exception of the shape of the resonator loop.

In FIG. 12, an RFID tag includes a substrate 1102 having printed thereon or therein an antenna element 1110. A strap 1101 is placed in close proximity with the antenna element 1110 and can also be place on the substrate 1102 (but need not be). The strap 1101 is placed in a location such that a resonator loop 1109 formed on a strap substrate 1103 is in close proximity to the antenna element 1110 for an inductive coupling. The strap 1101 includes the strap substrate 1103, the resonator loop 1109, and RFID integrated circuit 1104, and pad conductors 1106. The RFID integrated circuit 1104 can be embedded within a receptor provided on the strap substrate 1101 as previously disclosed. The RFID integrated circuit 1104 can also be attached, placed, affixed, or otherwise secured to the strap substrate 1101 using other suitable methods. The RFID integrated circuit 1104 include contact pads (not shown) which are connected to pad conductors formed on the strap substrate 1101 to allow the RFID integrated circuit 1104 to be electrically coupled to external conductive elements (e.g., antenna).

As shown in FIG. 12, the pad conductors 1106 are connected to the portions of the resonator loop 1109. The resonator loop 1109 is formed with many folds or loops to allow the inductance of the loop to be large enough to cancel the capacitance of the chip. In the present embodiment, the shape of the resonator loop 1109 is selected so that it is suitable for a operation at a particular frequency range, for example, about 915 MHz range for a strap 1101 of a size about 9×4.5 mm.

As before, the substrate 1102 can be the packaging of a product (e.g., a box or cover). The substrate 1102 can also be a label that is affixed to a location on the packaging of a product. The substrate 1102 can also be made to include an adhesive label or other material to allow the placement of the substrate 1102 to a product. The strap 1101 with resonator loop 1108 can be sized so that it is no larger in size or area than a postage stamp or the like.

Figure 13:
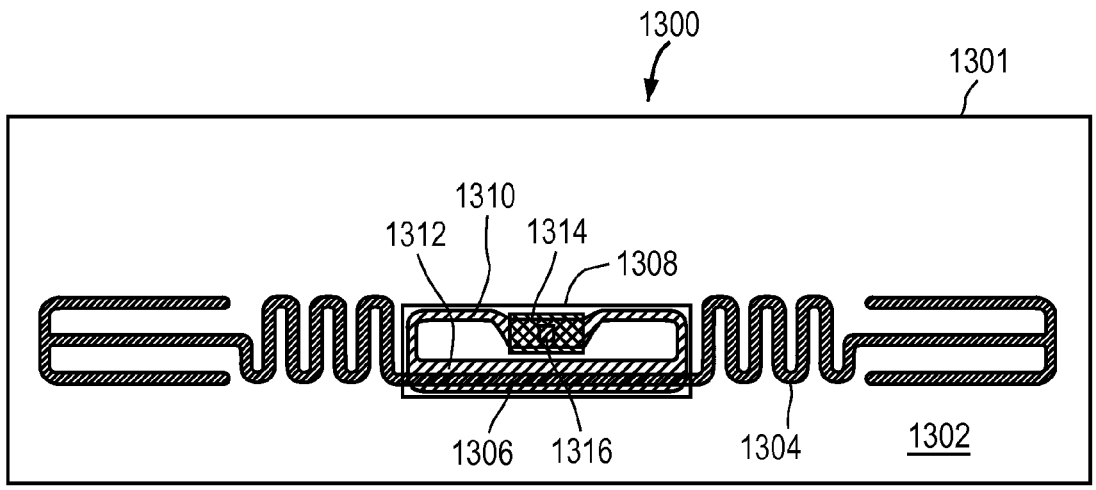
FIGS. 13-16 illustrate various placement of a resonator assembly with an antenna for an inductive or capacitive coupling with FIGS. 13, 14, and 15 showing inductive and FIG. 15 showing capacitive coupling.

FIG. 13 illustrates an exemplary embodiment of an inductive coupling between a resonator assembly 1308 and an antenna assembly 1301. In the present embodiment, the antenna assembly 1301 can placed so that a portion of an antenna element 1304 overlaps with a portion of a resonator loop 1310. Additionally, the portion of the resonator loop 1310 that overlaps with the portion of the antenna 1302 can be made larger, significantly larger (e.g., two to five times larger) or have greater width (e.g., two to five times larger) as shown in the example of FIG. 13. Greater or larger portion permits a greater positional variability in the placement of the resonator loop 1310 to be in proximity with the antenna element 1304.

In more details, an RFID device 1300 of FIG. 13 is formed when the resonator assembly 1308 is inductively coupled to the antenna assembly 1301. As before, the resonator assembly 1308 includes a strap 1314, which has an RFID chip 1316 included therein, and a resonator loop 1310 formed on a substrate. The resonator loop 1310 is connected to the chip 1316 through conductive elements such as contact pads (not shown) provided on the chip 1316 and the pad conductors (not shown) formed on the strap 1314. The antenna assembly 1301 includes a device substrate 1302 with the antenna element or loop 1304 formed therein or thereon. In the embodiment illustrated in FIG. 13, the resonator loop 1304 includes a portion 1312 that is larger or substantially larger in width compared to the rest of the resonator loop 1310. In one embodiment, the resonator assembly 1308 is placed in proximity with the antenna assembly 1301 with the portion 1312 overlapping a portion 1306 of the antenna loop 1304. The resonator loop 1310 needs not to overlap the antenna element for a coupling to occur as illustrated in FIG. 14.

Figure 14:
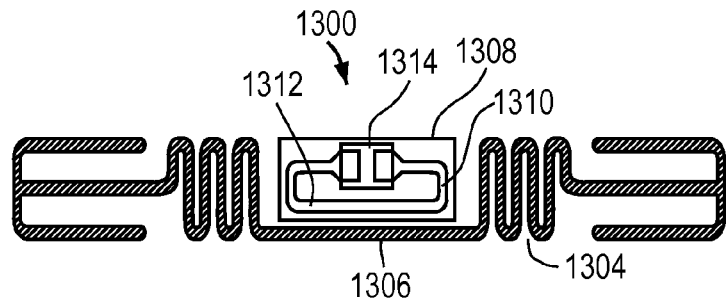

FIG. 14 illustrates an exemplary embodiment of an inductive coupling between a resonator assembly and an antenna assembly. In the present embodiment, the antenna assembly is placed close to or proximate to a portion of a resonator loop. Although not shown in FIG. 14, the portion of the resonator loop that is near the portion of the antenna can also be made larger, significantly larger (e.g., two times to five times) or have greater width (e.g., two times to five times) as in the previous embodiment. Greater or larger portion permits a greater positional variability in the placement of the resonator loop to be in proximity with the antenna element.

Comparing to the embodiment shown in FIG. 13, there is no overlapping placement between the resonator assembly and the antenna assembly. In the present embodiment, resonator loop couples to the non-connected antenna element inductively by just being close to the each other.

In more details, an RFID device 1300 of FIG. 14 is formed when the resonator assembly 1308 is inductively coupled to the antenna assembly 1301 simply by being close to the antenna assembly 1308. The RFID device 1300 in FIG. 14 is similar to that in FIG. 13 except for the proximity of the resonator assembly to the antenna assembly. The resonator assembly 1308 includes a strap 1314, which has an RFID chip 1316 included therein, and a resonator loop 1310 formed on a substrate. The resonator loop 1308 is connected to the chip 1316 through conductive elements such as contact pads (not shown) provided on the chip 1316 and the pad conductors (not shown) formed on the strap 1314. The antenna assembly 1301 includes a device substrate 1302 with the antenna element or loop 1304 formed therein or thereon. The resonator loop 1304 may include a portion 1312 that is larger or substantially larger in width compared to the rest of the resonator loop 1310. Additionally, the antenna loop 1304 may also include a portion 1306 that is larger or substantially larger in width compared to the rest of the antenna loop 1304. In one embodiment, the resonator assembly 1308 is placed in proximity with the antenna assembly 1301 with no overlapping.

Figure 15:
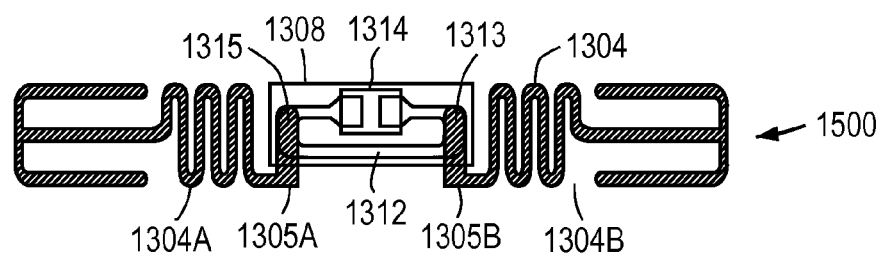

FIG. 15 illustrates an exemplary embodiment of a capacitive coupling between a resonator assembly and an antenna assembly. In the present embodiment, the antenna assembly is placed in an overlapping manner with respect to a resonator assembly. In one embodiment, a portion of the resonator loop is placed so that it overlaps (but not direct contact as there is a dielectric layer, a substrate, or an adhesive layer separating the resonator loop and the antenna loop, previously discussed, FIG. 8) the antenna element. Additionally, the portion of the resonator loop that overlaps with the portion of the antenna can also be made larger, significantly larger (e.g., two times to five times) or have greater width (e.g., two times to five times) as shown in the example of FIG. 15. Greater or larger portions permit a greater positional variability in the placement of the resonator loop to be overlapped with the antenna elements for a capacitive coupling. It is also desirable to have a larger overlap area for increased capacitive coupling.

In one embodiment, the capacitive coupling between the resonator loop and the antenna element is accomplished with overlapping lobes at the ends of the antenna element. Further, the antenna element comprises two sections, each with one end overlapping a lobe of the resonator loop as shown in the figure.

In more details, an RFID device 1500 of FIG. 15 is formed when the resonator assembly 1308 is capacitively coupled to the antenna assembly 1301. Similar to before, the resonator assembly 1308 includes a strap 1314, which has an RFID chip 1316 included therein, and a resonator loop 1310 formed on a substrate. The resonator loop 1310 further includes a lobe 1315 and a lobe 1313, and a middle portion 1312. As before, the resonator loop 1310 is connected to the chip 1316 through conductive elements such as contact pads (not shown) provided on the chip 1316 and the pad conductors (not shown) formed on the strap 1314. The antenna assembly 1301 includes a device substrate 1302 with two antenna elements 1304A and 1304B formed therein or thereon. The resonator loop 1310's lobes 1315 and 1313 may be made larger or substantially larger in width compared to the rest of the resonator loop 1310. Additionally, the antenna elements 1304A and 1304B each may also include a portion 1305A and 1305B that is larger or substantially larger in width compared to the rest of the antenna element. In one embodiment, the lobe 1315 of the resonator loop 1310 overlaps with the portion 1305A of the antenna element 1304A; and the lobe 1313 of the resonator loop 1310 overlaps with the portion 1305B of the antenna element 1304B.

Figure 16:
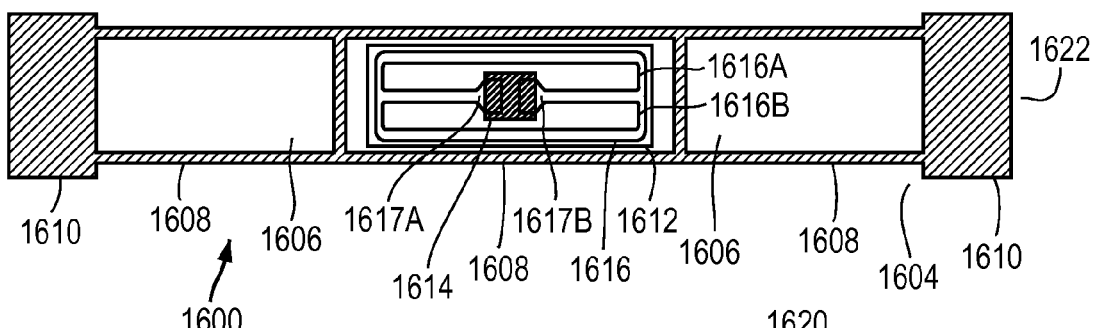

FIG. 16 illustrates an exemplary embodiment of an inductive coupling between a resonator assembly and an antenna assembly. In addition, the resonator assembly comprises a double inductor loop, which can be used to reduce placement inaccuracy with respect to the antenna assembly. The resonator structure with a double inductor loop may be referred to as a resonator with a double-loop configuration since there are at least two loops comprised within the resonator structure. The resonator assembly in the present embodiment can be larger than those previously discussed to accommodate the double resonator loops. In one embodiment, the resonator assembly can be placed in the middle of the antenna assembly as shown in the example in FIG. 16. The resonator assembly can also be placed in proximity to the antenna similar to previously discussed.

In more details, an RFID device 1600 of FIG. 16 is formed when the resonator assembly 1612 is inductively coupled to the antenna assembly 1604 by being placed in close proximity to the antenna assembly 1604. The resonator assembly 1612 includes a strap 1614, which has an RFID chip (not labeled) included therein, and a resonator structure 1616 formed on a substrate. The resonator structure 1616 comprises of two resonator loops 1616A and 1616B. The resonator structure 1616 is connected to the chip through conductive elements 1617A and 1617B such as through contact pads (not shown) provided on the chip and the pad conductors (not shown) formed on the strap 1314. The antenna assembly 1604 may include a device substrate 1620 with the antenna element or loop 1622 formed therein or thereon. The antenna loop 1622 may be comprised of an opening 1608, sidewalls 1610, and sides 1808. The resonator assembly 1612 can be placed within a portion 1606 (as illustrated in the example in FIG. 16) or be placed proximate to the antenna structure 1622 for an inductive coupling between the resonator assembly and the antenna assembly to form the RFID device.

Figure 17:
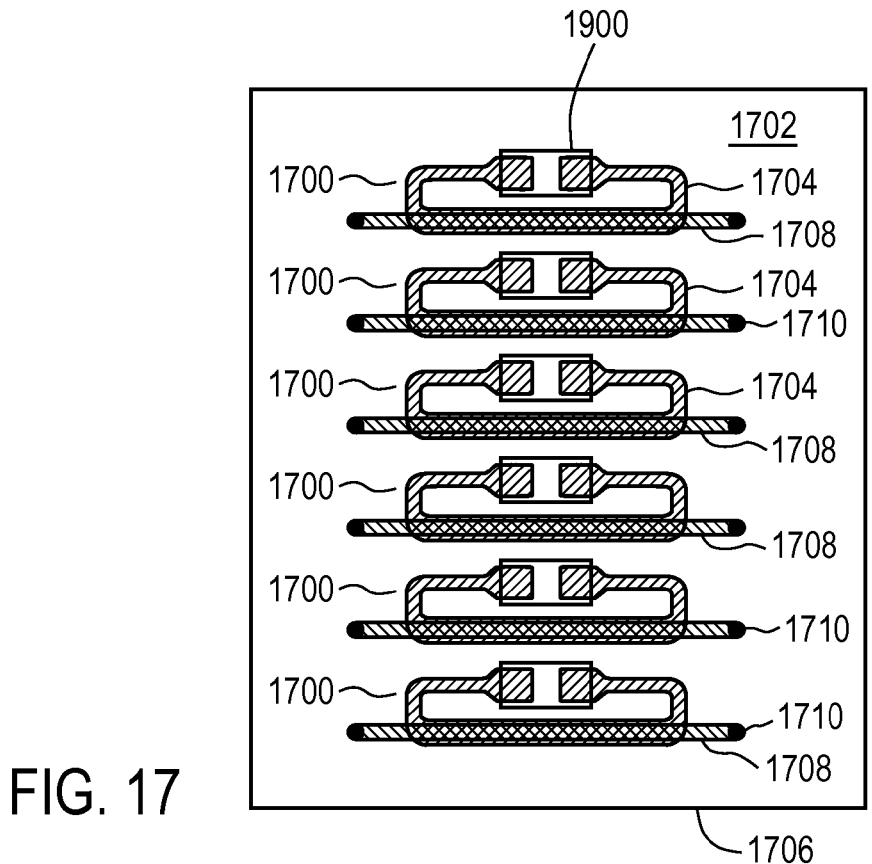
FIGS. 17-18 illustrate exemplary embodiments of test boards that can be used to test a plurality of resonator assemblies through capacitive coupling or inductive coupling.
Figure 18:
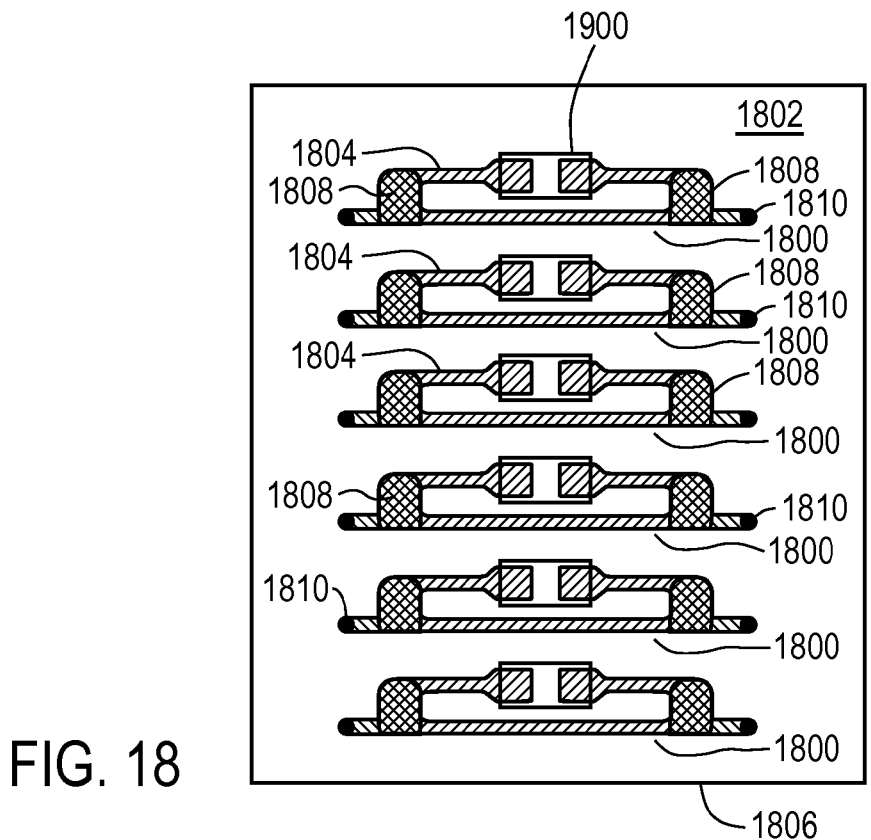

As previously mentioned, a resonator assembly can be made using web processing methods. It is desirable to test the function of the resonator assembly prior to coupling it to another device. In one embodiment, the resonator assembly includes an RFID integrated circuit chip and interconnections such as pad conductors that connect the chip to a respective resonator loop. As illustrated in FIGS. 17-18, a plurality of resonator assemblies are formed on a section of a web material. A test apparatus is provided so that all of the resonator assemblies can be tested prior to assembling them to a final device to form RFID devices.

FIG. 17 illustrates inductively coupled resonator assemblies 1700 on a web material 1702 while the resonator assemblies 1700 are being tested. FIG. 18 illustrates capacitively coupled resonator assemblies 1800 on a web material 1802 while the resonator assemblies 1800 are being tested. In one embodiment, a plurality of resonator assemblies (e.g., 1700 or 1800) are formed on a section of a web material (e.g., 1702 or 1802). For each resonator assembly, the RFID integrated circuit is on a strap which is shown as a rectangle 1900 in FIGS. 17-18 and each resonator loop (e.g., 1704 or 1804) in each resonator assembly is electrically coupled (e.g., a DC, resistive coupling, inductive coupling, or capacitive coupling) to its corresponding RFID integrated circuit on the resonator assemblies. The resonator loop coupled to the integrated circuit in the strap is referred to as a resonator assembly.

It is desirable that the resonator assemblies on the web material (in a roll to roll manufacturing process) be tested before they are each applied to an antenna on a different substrate. In an exemplary embodiment shown in FIG. 17, a test board 1706 is provided for testing the resonator assemblies 1700. The test board 1706 comprises a plurality of functional test lines 1708. In one embodiment, the functional test lines 1708 are formed or provided on a printed circuit board (or the test board 1706) where the circles depict vias 1710 allowing electrical interconnection down to and RF current source and RF ground. The functional test lines 1708 are thus electrically interconnectable to the respective resonator loops 1704 through the vias 1710. In one embodiment, the resonator loops 1704 are positioned over the test lines 1708 on the test board 1706 and are tested from the inductive coupling or other desirable functional tests.

In an exemplary embodiment shown in FIG. 18, a test board 1806 is provided for testing the resonator assemblies 1800. The test board 1806 comprises a plurality of functional test features or elements 1808. In one embodiment, the functional test features or elements 1808 are formed or provided on a printed circuit board (or the test board 1806) where the circles depict vias 1810 allowing electrical interconnection down to and RF current source and RF ground. The functional test elements 1808 are thus electrically interconnectable to the respective resonator loops 1804 through the vias 1810. In the present embodiment, the test features 1808 are interconnected to the respective resonator loops 1804 through capacitive couplings as previously discussed. In one embodiment, the resonator loops 1804 are positioned to be contacting the test features 1808 on the test board 1806 and are tested from the capacitive coupling or other desirable functional tests.

It can be envisioned that the resonator assemblies are formed on a web processing line and tested on the same line at a test station equipped with the appropriate test boards. Thus, the resonator assemblies may be functionally tested prior to being separated or cut and assembled with antenna assemblies to form RFID devices.

In one embodiment, the resonator can be applied to the antenna assembly provided on a packaging or a cover of an item with an adhesive coverlay with a release layer on the top of the resonator assembly, such that the resonator assembly is attached with the integrated circuit chip facing the antenna. Alternatively, the adhesive could be on the back side of the resonator.

In one embodiment, the antenna element is designed to be resonant at the same given frequency (usually close to the design frequency) as the integrated circuit chip. In such embodiment, one can adjust the match of the two resonant circuits of the antenna element and the integrated circuit by adjusting their coupling and fine tuning the resonance.

In any of the embodiments of the present invention, the antenna element can be affixed to a packaging of an item, or can be the item itself. For instance, the antenna element can be a metal or conductive structure already existing in a particular product, such as a foil seal of a bottle, a foil label, a section of a metal-containing device (e.g., a CD-ROM), a razor, a metal can, or a medicine cap, etc. The resonator assembly can then be inductively coupled or capacitively coupled to the antenna element as previously described.

Figure 19:
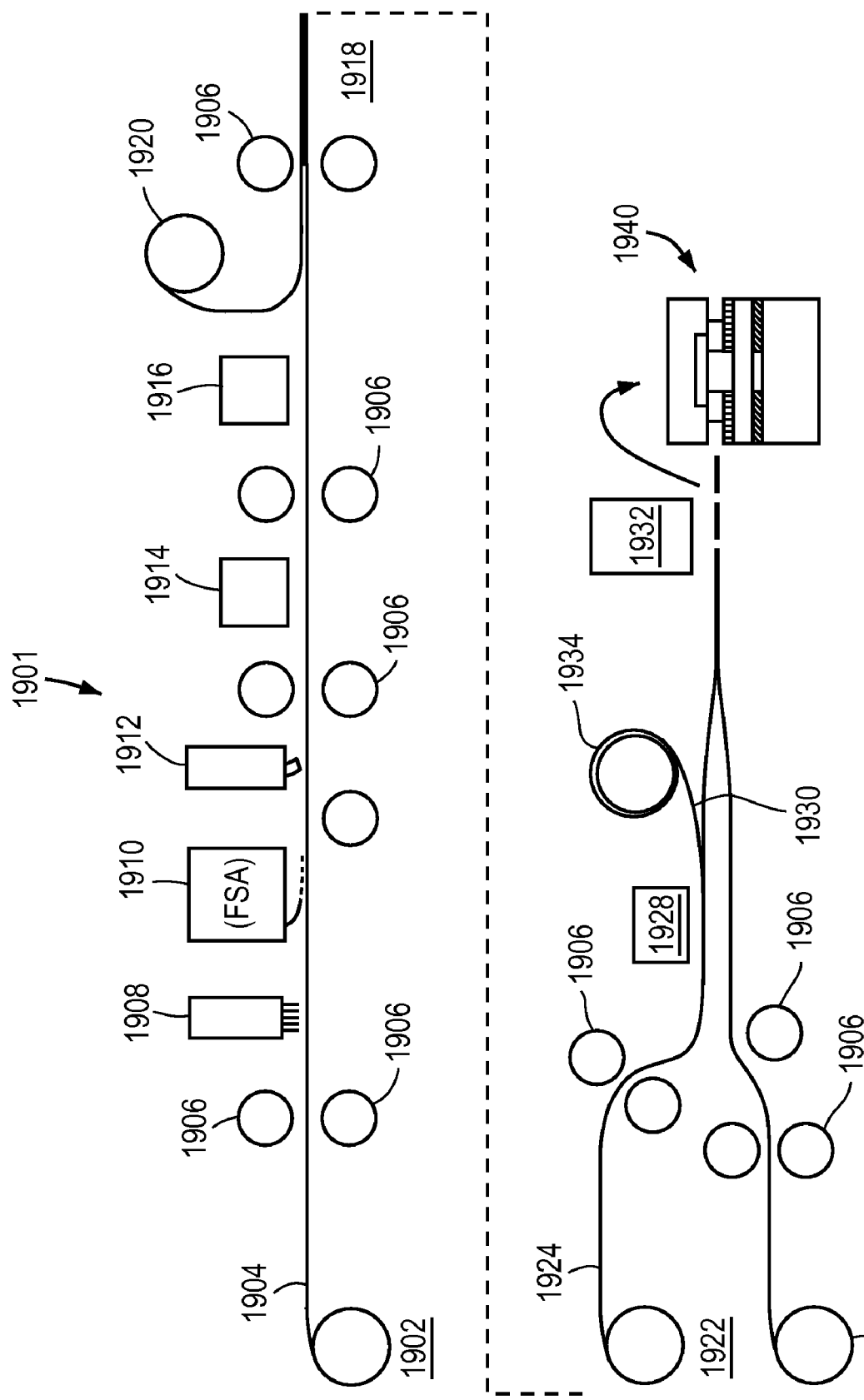
FIG. 19 illustrates an exemplary embodiment of an overall process of making an electronic assembly with functional block in accordance to embodiments of the present invention.

FIG. 19 illustrates an exemplary process line 1901 of forming an RFID device in according to embodiments of the present invention. It is to be appreciated that even though a web processing method is used to assemble the RFID device, individual sheet stocks can be used instead of web stocks to form such devices. At 1902, a roll of raw material 1904 is provided that can be used for substrate portion of a strap. In one embodiment, a suitable material that can be used for an FSA process is provided. The substrate material can be a sheet substrate or a web substrate.

A plurality of support rolls 1906 are provided through out the process line 1900 to provide appropriate tensions for the web material.

The raw material 1904 may be comprised of polyether sulfone (PES), polysulfone, polyether imide, polyethylene terephthalate, polycarbonate, polybutylene terephthalate, polyphenylene sulfide (PPS), polypropylene, polyester, aramid, polyamideimide (PAI), polyimide, nylon material (e.g. polyiamide), aromatic polyimides, polyetherimide, polyvinyl chloride, acrylonitrile butadiene styrene (ABS), or metallic materials. Additionally, the raw material 1904 when in a web process can be a flexible sheet with very high aspect ratios such as 25:1 or more (length:width). As is known, a web material involves a roll process. For example, a roll of paper towels when unrolled is said to be in web form and it is fabricated in a process referred to as a web process. When a web is coiled, it is in roll form.

Although the discussion below illustrates processes that may be continuous, other separate or sub-processes can also be used. For instance, a process that is continuous as shown in FIG. 19 can be separated into separate or sub-processes. The process 1900 in FIG. 19 can take place on one machine or on several machines. The process line in FIG. 19 can also be controlled by a programmable machine equipped with a processor or a control unit as is known in the art.

In one embodiment, the raw material 1904 may be sprocket-hole-punched to assist in web handling. The web material 1904 is advanced to a device 1908 that is configured to forms a plurality of recessed regions (not shown) in the web material 1904. The recessed regions can be formed by machining, etching, casting, embossing, extruding, stamping, or molding. In one embodiment, a roller with protruding structures is provided for the formation of the recessed regions. The web material 1904 may be advanced through a set of support members 1906 as the recessed regions are created into the web material 1904.

In one embodiment, a fluid self-assembly process is used to deposit a plurality of functional blocks into the recessed regions formed in the web material 1904. The functional blocks include integrated circuits that are configured for working with an RFID devices. In one embodiment, an FSA station 1910 is provided so that a slurry containing a plurality of functional blocks is dispensed onto the web material 1904. More than one slurry passes may be performed to deposit the same type of functional blocks of different types. Excess slurry may be collected in a container (not shown) provided in the process and is recycled. The functional blocks fall into the recessed regions in the web material 1904.

The web material 1904 is then advanced to another station. For example, an inspection station 1912 may be provided to check for empty recessed regions or for improperly filled recessed regions. The inspection station 1912 can also be used to check for other defects such as electrical function or orientations of the functional blocks if applicable or desired. There may also be a clearing device (not shown) to remove excess functional blocks or blocks not completely seated or deposited into the recessed regions of the web material 1904. A vibration device (not shown) may be coupled to the web material 1904 and/or to the FSA device 1910 to facilitate the distribution and/or of the functional blocks. An example of a dispensing device that can work with vibrational assistance to dispense the functional blocks is described in U.S. patent application Ser. No. 10/086,491, entitled "Method and Apparatus For Moving Blocks" filed on Feb. 28, 2002, which is hereby incorporated by reference in its entirety. In one embodiment, the functional blocks are deposited onto the substrate material using methods described in U.S. patent application Ser. No. 10/086,491. In one embodiment, the functional blocks are deposited onto the substrate using fluidic self-assembly process on a continuously moving web material 1904.

The functional blocks can have shapes such as square, rectangular, trapezoid, cylinder, asymmetric block, asymmetric rectangular, and asymmetric trapezoid. The recessed regions have similar shapes as the functional blocks.

Continuing with FIG. 19, at 1914, a dielectric layer is formed over the web material. The dielectric layer may be deposited or laminated or otherwise formed onto the web material 1904. Vias are formed in the dielectric film. The dielectric layer can be applied using a variety of methods. Most commonly, a solid dielectric film is used, which can be applied with a hot roll laminator. Alternatively, a liquid dielectric could be applied by spin coating in sheet form using any variety of a printing methods, such as direct writing, laser-assisted deposition, screen printing, or wet coating (e.g., by comma coating or other types of roll-to-roll liquid coaters). A liquid dielectric could either be dried or cured to form a solid dielectric layer. Curing could be thermally-activated, moisture-activated, microwave-activated, or UV light-activated. The dielectric layer can be cured or dried in-line as the layer is being formed.

In one embodiment, the dielectric film is formed by local printing processes or direct write processes (e.g., inkjet printing, digital printing, pen/stylus based deposition, optical or laser assisted deposition, syringe dispense, Xerographic printing, and the like). A direct write device (e.g., an inkjetting machine) may be provided and controlled by a computer program or machine that can control the selective deposition of the dielectric material. The direct write device can also be coupled to a guidance system or an optical guidance system that recognizes or registers the locations of registration marks on the web material 1904. With such direct write device and the guidance system, the dielectric film can be selectively formed on the web material 1904 at specified locations.

In one embodiment, the deposition of the functional blocks by FSA and the formation of the dielectric film are done on the same machine. Thus, after the functional blocks are deposited, the web material 1904 is advanced to a station at 1914 where the dielectric layer is formed.

In one embodiment, the dielectric film is formed over the functional blocks using the continuously moving web. In one embodiment, the dielectric layer is selectively applied in only specific locations, e.g., on the substrate areas with the functional blocks and/or over certain area of the functional blocks. In the embodiment where the dielectric layer is selectively deposited, it may assist in adhering the functional blocks in the recesses, and it may not be necessary to form vias since it can be configured or programmed in the printing device that the dielectric material is not printed where electrical interconnections are to be formed to and from the functional blocks.

In one embodiment, vias are formed into the dielectric layer to allow for interconnections to and from the functional blocks. To form the vias that can expose the contact pads on the functional blocks, the substrate with the functional blocks deposited therein is inspected by an optical scanner (not shown) prior to via formation to determine the location of the contact pads on the functional blocks that need vias over them. Preferably, this inspection is done in-line with the via formation process, and the image analysis is done automatically by a computerized vision system (not shown), and the results are sent directly to the via formation apparatus to select which vias to form. As a result, vias are only formed in the dielectric above the contact pads of the functional blocks.

The via opening(s) in the dielectric layer can be opened either before or after the dielectric film is placed on the functional blocks-filled substrate. The openings could be punched prior to dielectric layer application to the filled substrate web, or could be created by etching, photolithography, or by laser via drilling after the dielectric film is deposited over the substrate. Laser drilling can be used to form the vias, which could be accomplished with either a UV, visible, or IR laser. To avoid some potential problems or damages with some conventional drilling techniques to form vias, a laser drilling is used. For instance, damages may happen in a conventional drilling method when drilling is done to remove the dielectric material over the output pads on the functional blocks and when drilling is done on the locations on the blocks where there is no output pads causing damages to the blocks' passivation layer. In one embodiment, a protective bump (conductive bump or gold bump) is placed on the output pads of the functional blocks to the protect the output pads from being drilled. Additionally, the substrate is scanned (e.g., using a 720 dpi scanner) for the orientation and location of the functional blocks in the substrate prior to drilling to allow accurate drilling through the dielectric layer.

In one embodiment, a program is provided and used to control the dielectric layer deposition onto the substrate and the functional blocks. As the scanner scans for the orientation of the functional blocks, an output file can be read by the laser. The program may be used to determine proper drilling locations according to the output from the scanning and execute proper drilling steps. In one embodiment, a Third Harmonic YAG UV laser is used for drilling vias in the dielectric layer.

In one embodiment, a UV-laser is used to form the via openings in the dielectric layer. Laser via drilling can be accomplished with either a long pulse of energy, or a series of short pulses. In the case of a series of short pulses, the position of the laser can be adjusted so that one or more pulses occur in different positions within each via. A via with a wider, non-circular opening can be created by laser drilling partially through the dielectric film. The vias could also be self-forming in liquid systems that, after application to the functional block-filled substrate web, selectively de-wet off of the contact pads on the functional blocks.

Continuing with FIG. 19, at 1969, conductive interconnects (e.g., pad conductors) are then formed into and on the dielectric film to establish electrical interconnection to the functional blocks. In one embodiment, the conductive interconnects are formed in a continuously moving web. The conductive interconnects also fill the vias to allow electrical interconnection to the functional blocks. In one embodiment, the vias are filled with a conductive material to form via conductors. A pad conductor is then formed on the dielectric film to interconnect to each via conductor. Each pad conductor and via conductor can form a conductive interconnect and/or be made of the same materials and in one process in many embodiments. The via conductors and the pad conductors can be formed on a continuously moving web material 1904.

The conductive interconnections can be formed by any of a variety of conductive composite printing methods, including screen printing or gravure printing. In some embodiments, the conductive interconnects are formed by a local printing method such as direct write deposition. The conductive material is typically thermally-cured or UV-cured, or cured by air-drying. In other embodiments, the conductive interconnects are formed by a direct-write or an adaptive-wiring process (e.g. ink-jet printing, digital printing, pen/stylus based deposition, optical or laser assisted deposition, syringe dispense, Xerographic printing, and the like). In the case of direct-write or adaptive wiring, the positioning of each individual conductive interconnect can be controlled by a machine vision system or a guidance system locate the proper location for forming the interconnects.

The interconnects can be made of one or more of the following: conductive particles dispersed in a nonconductive matrix (e.g., silver ink, sputtered/evaporated metal, conductive carbon composites, carbon nanotubes) or inorganic nanowires dispersed in a nonconductive matrix (e.g., a thermoplastic polymer, a thermoset polymer, or a B-staged thermoset polymer), or any of these materials combined with metallic nanoparticles. The interconnect materials are prepared so that they can be deposited on a continuously moving web.

A station (not shown) may be provided for the inspection or testing of the functionality of the strap assemblies that include the functional blocks and the interconnections. The assemblies are tested for functionality such that known-bad assemblies can be marked, so that they can be actively avoided in future process steps. Known-good assemblies can be marked, so that they can be actively selected in future process steps. The mark can be an ink mark, ink jet marking, stamping, or a laser burn mark, or any other mark that is detectable by either a human eye, a sensor, or both. In one embodiment, the marking is a laser marking and is applied to the particular pad conductors so as to leave a black mark on the pad conductors. In one embodiment, the tests are done by coupling the electromagnetic energy from the tester to the assemblies. The coupling can be resistive, inductive, or capacitive, or a combination thereof, using contact methods (e.g., direct electrical contact), non-contact methods, or a combination thereof. Even in a densely-packed set of straps, individual assemblies can be tested without undue interference from neighboring devices. In one embodiment, individual assemblies are tested based on a predefined set of criteria or parameters, for instance, one assembly out of every 10 assemblies formed on a web is tested. Other criteria or parameters are of course possible.

At 1918, resonator loops are joined to respective strap assemblies. In one embodiment, a roll of resonator materials 1920 is provided. The resonator material can be formed independently, for example, by having a plurality of resonator loops formed on a substrate. Alternatively, the plurality of resonator loops can be formed directly on the web material 1904 similar to how a conductive loop is formed on a substrate. At 1918, the resonator loops are interconnected to the respective functional blocks through the interconnects on the straps or through the pad conductors previously formed. At this point, the assemblies are referred to as resonator assemblies which have the functional blocks properly interconnected to the resonator loops.

At 1922, the resonator assemblies can be rolled up as a web material 1924 for subsequent assembly. The web material 1924 has a plurality of resonator assemblies formed therein. Additionally, a roll of antenna assemblies 1926 is provided for assembling to the respective resonator assemblies. At 1928, the antenna assemblies from the roll 1926 and the resonator assemblies from the roll 1922 are coupled to one another. It is to be appreciated that pitch matching, indexing, and/or registration may be required. As previously mentioned, the resonator assemblies may be formed in much more high density per area of a web material in comparison to the antenna assemblies. Thus, to align a resonator assembly to an antenna assembly, even though strict alignment is not required according to the embodiments of the present invention, some indexing may be required so that one resonator assembly goes to one antenna assembly.

In one embodiment, the resonator assemblies are carried on a web that has a release liner coupled thereto such that the removal of the release liner 1930 allows the resonator assemblies to be attached to the antenna assemblies.

In one embodiment, a test station 1932 is provided with a test board such as those previously discussed with respect to FIGS. 17-18 which can be used to test a plurality of resonator assemblies. The test station 1932 can be placed before the release liner take-up 1934 or after the release liner take up 1934. Other take-up stations may be included so that the extra or unused material can be lifted off. An RFID device 1940 is formed after the final assembly of the antenna assembly and the resonator assembly to one another.

In designing the antennas for any of the embodiments of the present invention, the antenna elements can be modeled in a 2-D or 3-D antenna modeling software. This allows for optimization of the antenna/loop designs over a given frequency range. After the modeling is correct, a prototype antenna with slight variation can be built and the best one selected. Further iteration prototype antennas can be built with slight dimensional changes until the optimum design is achieved.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A device comprising:
   an antenna assembly having an antenna element; and
   a resonator assembly having an integrated circuit connected to a resonator loop, wherein the resonator loop has an inductance configured to cancel a capacitance of the integrated circuit, wherein the resonator loop has an inductor configured to electrically couple the integrated circuit with the antenna element while avoiding a physical contact with the antenna element, wherein a size of the resonator loop is selected to have the inductance to cancel the capacitance of the integrated circuit.

2. The device of claim 1, further comprising a dielectric layer between the antenna element and the resonator loop.

3. The device of claim 1 wherein the antenna assembly has a first substrate coupled to the antenna element.

4. The device of claim 1, wherein the resonator assembly has a second substrate coupled to the resonator loop.

5. The device of claim 1 wherein the integrated circuit and the resonator loop are formed on a same substrate.

6. The device of claim 1 wherein the integrated circuit is inductively coupled to the antenna element.

7. The device of claim 1 wherein the integrated circuit is capacitively coupled to the antenna element.

8. The device of claim 1 wherein the antenna assembly further comprising at least two antenna elements electrically isolated from one another and wherein each one of the antenna elements includes at least a portion that is capacitively coupled to the resonator loop.

9. The device of claim 1 wherein the resonator loop is placed in proximity and not in physical contact with the antenna element for an inductive coupling between the integrated circuit and the antenna element.

10. The device of claim 1 wherein the resonator loop includes a portion that overlaps to a portion of the antenna element for an inductive coupling between the integrated circuit and the antenna element.

11. The device of claim 1 wherein the resonator assembly further comprising:
    pad conductors to interconnect the integrated circuit to the resonator loop.

12. The device of claim 1 wherein the resonator loop has a double-loop configuration.

13. The device of claim 1 wherein the antenna assembly is attached to or at least is part of a packaging of an item.

14. A device comprising:
    an antenna assembly having an antenna element; and
    a resonator assembly having an integrated circuit connected to a resonator loop, wherein the resonator loop has an inductance configured to cancel a capacitance of the integrated circuit to electrically couple the antenna element to the resonator loop while avoiding a physical contact with the antenna element, wherein a size of the resonator loop is selected to have the inductance to cancel the capacitance of the integrated circuit, wherein the resonator assembly has a second substrate coupled to the resonator loop, and wherein the resonator assembly further comprises
    a third substrate having the integrated circuit embedded therein, wherein the resonator loop is formed on the second substrate, and wherein the third substrate is coupled to the second substrate such that an electrical interconnection is formed from the integrated circuit to the resonator loop.

15. An RFID device comprising:
    an antenna; and
    a resonator assembly comprising a first substrate having an integrated circuit coupled to a resonator loop, wherein the resonator loop has an inductance to cancel a capacitance of the integrated circuit,
    wherein the antenna is electrically coupled to the integrated circuit via an inductor in the resonator loop that lacks direct contact with the antenna, wherein a size of the resonator loop is selected to have the inductance to cancel the capacitance of the integrated circuit.

16. The RFID device of claim 15 further comprising a dielectric layer between the antenna and the resonator loop.

17. The RFID device of claim 15 wherein the antenna is formed on a second substrate, the second substrate being attached to the first substrate.

18. The RFID device of claim 15 wherein the antenna further comprises at least two antenna elements disposed apart by a non-conductive area and wherein each one of the antenna elements include an end that is capacitively coupled to the resonator loop.

19. The RFID device of claim 15 wherein the resonator loop is placed in proximity and not in physical contact with the antenna for an inductive coupling between the integrated circuit and the antenna.

20. The RFID device of claim 15 wherein the resonator loop and the integrated circuit is each formed on a separate substrate.

21. The RFID device of claim 15 wherein the resonator loop has a double-loop configuration.

22. An RFID device comprising:
an antenna; and
a resonator assembly comprising a first substrate having an integrated circuit coupled to a resonator loop, wherein the resonator loop has an inductance to cancel a capacitance of the integrated circuit, wherein the antenna is electrically coupled to the integrated circuit via the resonator loop that lacks direct contact with the antenna, wherein a size of the resonator loop is selected to have the inductance to cancel the capacitance of the integrated circuit, wherein the first substrate includes a receptor site, the integrated circuit being at least partially embedded within the receptor site.

23. A method for forming a device, the method comprising:
forming a resonator assembly, the resonator assembly comprising an integrated circuit connected to a resonator loop; and
electrically coupling an antenna to the integrated circuit via an inductor in the resonator loop, the resonator loop lacking direct contact with the antenna, wherein a size of the resonator loop is selected to have the inductance to cancel the capacitance of the integrated circuit.

24. The method of claim 23, further comprising
forming an antenna on a first substrate.

25. The method of claim 23 wherein the forming the resonator assembly comprises
forming a resonator loop on a second substrate.

26. The method of claim 23, further comprising
forming a dielectric layer between the resonator loop and the antenna.

27. The method of claim 23, wherein the forming the resonator assembly comprises
forming the integrated circuit on a third substrate.

28. The method of claim 23, wherein the forming the resonator assembly comprises
selecting an inductor of the resonator loop to cancel the capacitance of the integrated circuit.

29. The method of claim 23, wherein the forming the resonator assembly comprises
selecting a shape of the resonator loop to couple to the antenna for a operation at a predetermined frequency range.

* * * * *